United States Patent
Jung et al.

(10) Patent No.: US 10,319,425 B1
(45) Date of Patent: Jun. 11, 2019

(54) OFFSET-CANCELLATION SENSING CIRCUIT (OCSC)-BASED NON-VOLATILE (NV) MEMORY CIRCUITS

(71) Applicants: QUALCOMM Incorporated, San Diego, CA (US); Yonsei University, University-Industry Foundation, Seoul (KR)

(72) Inventors: Seong-Ook Jung, Seoul (KR); Byungkyu Song, Seoul (KR); Sungryul Kim, San Diego, CA (US); Jung Pill Kim, San Diego, CA (US); Seung Hyuk Kang, San Diego, CA (US)

(73) Assignees: QUALCOMM Technologies Incorporated, San Diego, CA (US); Yonsei University, University-Industry Foundation, Seoul (KR)

( * ) Notice: Subject to any disclaimer, the term of this patent is extended or adjusted under 35 U.S.C. 154(b) by 0 days.

(21) Appl. No.: 15/939,514

(22) Filed: Mar. 29, 2018

(51) Int. Cl.
G11C 11/16 (2006.01)

(52) U.S. Cl.
CPC ...... G11C 11/1673 (2013.01); G11C 11/1659 (2013.01)

(58) Field of Classification Search
CPC .................................. G11C 7/08; G11C 8/08
USPC .................................................. 365/154, 205
See application file for complete search history.

(56) References Cited

U.S. PATENT DOCUMENTS

| 5,539,279 A * | 7/1996 | Takeuchi | G11C 11/22 365/145 |
| 6,462,998 B1 * | 10/2002 | Proebsting | G11C 7/04 257/E21.659 |
| 7,760,538 B1 * | 7/2010 | Paak | G11C 11/412 365/148 |
| 8,670,266 B2 | 3/2014 | Jung et al. | |
| 9,196,337 B2 | 11/2015 | Jung et al. | |

(Continued)

OTHER PUBLICATIONS

Javanifard, Johnny et al., "A 45nm Self-Aligned-Contact Process 1Gb NOR Flash with 5MB/s Program Speed," 2008 IEEE International Solid-State Circuits Conference, ISSCC 2008, Session 23, 2008, pp. 424-425.

(Continued)

Primary Examiner — Michael T Tran
(74) Attorney, Agent, or Firm — W&T/Qualcomm

(57) ABSTRACT

Offset-cancellation sensing circuit (OCSC)-based Non-volatile (NV) memory circuits are disclosed. An OCSC-based NV memory circuit includes a latch circuit configured to latch a memory state from an input signal. The OCSC-based NV memory circuit also includes a sensing circuit that includes NV memory devices configured to store the latched memory state in the latch circuit for restoring the memory state in the latch circuit when recovering from a reduced power level in an idle mode. To avoid the need to increase transistor size in the sensing circuit to mitigate restoration degradation, the sensing circuit is also configured to cancel an offset voltage of a differential amplifier in the sensing circuit. In other exemplary aspects, the NV memory devices are included in the sensing circuit and coupled to the differential transistors as NMOS transistors in the differential amplifier, eliminating contribution of offset voltage from other differential PMOS transistors not included.

26 Claims, 20 Drawing Sheets

(56) References Cited

U.S. PATENT DOCUMENTS

| | | | |
|---|---|---|---|
| 9,378,781 B1 | 6/2016 | Jung et al. | |
| 10,152,271 B1* | 12/2018 | Willcock | G06F 3/065 |
| 2003/0057520 A1 | 3/2003 | Kawasumi | |
| 2004/0105301 A1* | 6/2004 | Toyoda | G11C 13/0004 365/154 |
| 2007/0002618 A1* | 1/2007 | Schoenauer | G11C 13/0004 365/185.08 |
| 2007/0041242 A1* | 2/2007 | Okazaki | G11C 11/412 365/154 |
| 2007/0165441 A1* | 7/2007 | Kurjanowicz | G11C 17/16 365/96 |
| 2009/0059657 A1* | 3/2009 | Cannon | G11C 11/4125 365/163 |
| 2009/0201730 A1* | 8/2009 | Lueng | G11C 11/404 365/185.08 |
| 2010/0202191 A1* | 8/2010 | Ahn | G11C 11/412 365/154 |
| 2011/0194342 A1* | 8/2011 | Sugiyama | G11C 14/0081 365/171 |
| 2011/0216573 A1* | 9/2011 | Abe | G11C 11/21 365/148 |
| 2011/0267914 A1 | 11/2011 | Ishikura et al. | |
| 2011/0280073 A1* | 11/2011 | Chiu | G11C 13/0002 365/185.08 |
| 2013/0135921 A1* | 5/2013 | Owada | G11C 11/21 365/148 |
| 2014/0063920 A1* | 3/2014 | Knickerbocker | G11C 7/20 365/156 |
| 2014/0169077 A1* | 6/2014 | Kolar | G11C 11/419 365/156 |
| 2014/0177356 A1* | 6/2014 | Su | G11C 7/1096 365/189.16 |
| 2015/0340606 A1* | 11/2015 | Tada | G11C 13/0002 257/4 |
| 2015/0357022 A1* | 12/2015 | Hush | G11C 11/4074 365/72 |
| 2016/0300614 A1* | 10/2016 | Nebashi | G11C 15/02 |
| 2017/0263323 A1* | 9/2017 | Campardo | G11C 16/0408 |

OTHER PUBLICATIONS

Jung, Youngdon et al., "An MTJ-based non-volatile flip-flop for high-performance SoC," International Journal of Circuit Theory and Applications, vol. 42, No. 4, Apr. 2014, pp. 394-406.

Kazi, Ibrahim et al., "Energy/Reliability Trade-Offs in Low-Voltage ReRAM-Based Non-Volatile Flip-Flop Design," IEEE Transactions on Circuits and Systems—I: Regular Papers, vol. 61, No. 11, Nov. 2014, pp. 3155-3164.

Na, Taehui et al., "High-Performance Low-Power Magnetic Tunnel Junction Based Non-Volatile Flip-Flop," 2014 IEEE International Symposium on Circuits and Systems (ISCAS), Jun. 1, 2014, pp. 1953-1956.

Ryu, Kyungho et al., "A Magnetic Tunnel Junction Based Zero Standby Leakage Current Retention Flip-Flop," IEEE Transactions on Very Large Scale Integration (VLSI) Systems, vol. 20, No. 11, Nov. 2012, pp. 2044-2053.

Sakimura, Noboru et al., "Nonvolatile Magnetic Flip-Flop for Standby-Power-Free SoCs," IEEE Journal of Solid-State Circuits, vol. 44, No. 8, Aug. 2009, pp. 2244-2250.

* cited by examiner

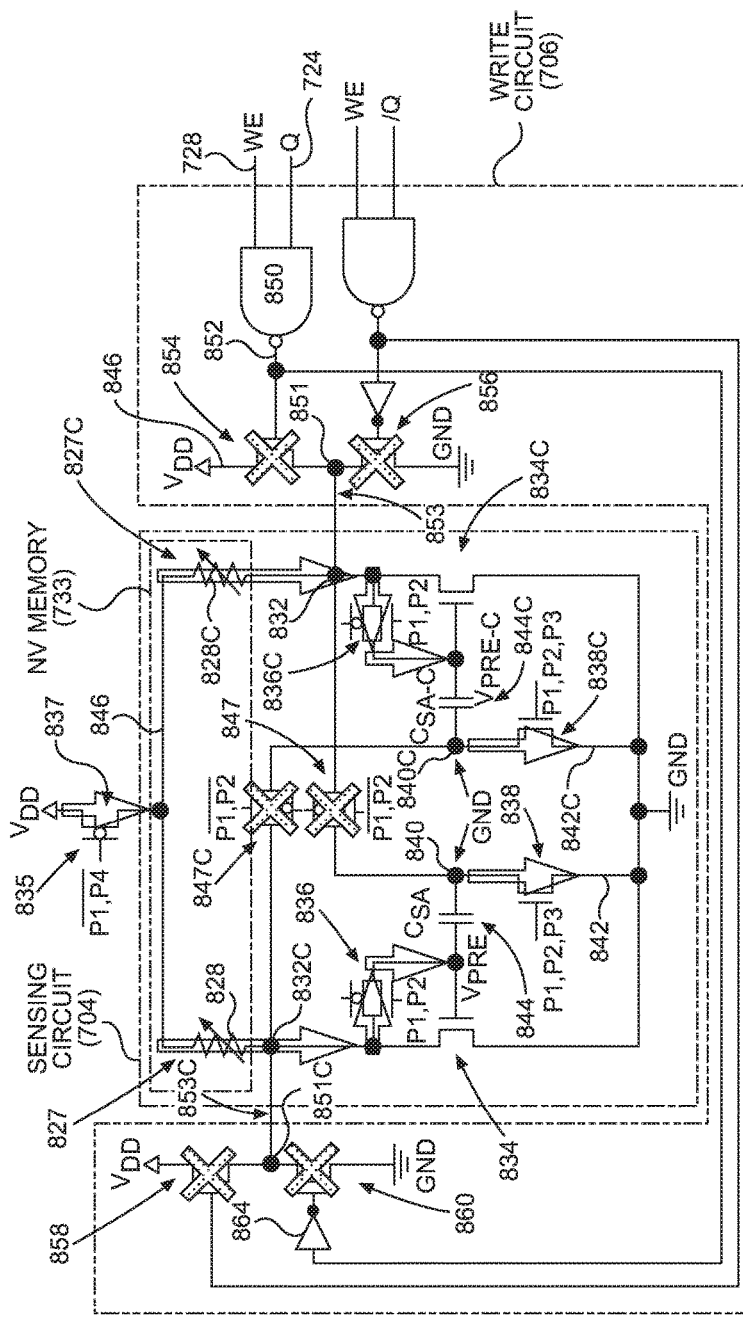

P1: PRE-CHARGE
P2: OFFSET-CANCELLING
P3: PRE-CHARGE
P4: COMPARISON

P1: PRE-CHARGE
P2: OFFSET-CANCELLING
P3: PRE-CHARGE
P4: COMPARISON

US 10,319,425 B1

OFFSET-CANCELLATION SENSING CIRCUIT (OCSC)-BASED NON-VOLATILE (NV) MEMORY CIRCUITS

BACKGROUND

I. Field of the Disclosure

The technology of the disclosure relates generally to offset-cancellation in sensing circuits used to sense differential voltages, and more particularly to sensing circuits with offset-cancellation provided in a memory circuit to sense a differential voltage representative of a stored memory state in the memory circuit.

II. Background

Semiconductor storage devices are used in integrated circuits (ICs) in electronic devices to provide data storage. One example of a semiconductor storage device is a flip-flop circuit, also known as a "flip-flop." A flip-flop is a basic storage element in sequential logic. Flip-flops and latches are fundamental building blocks of digital electronic systems used in computers, communications, and many other types of systems. A flip-flop is a circuit that has two (2) stable states and can be used to store state information. A flip-flop can be made to change state by signals applied to one or more control inputs, and will also have one or two outputs. For example, FIG. 1A illustrates an exemplary D flip-flop 100. The D flip-flop 100 has two inputs. One input is a control input 102 labeled 'D', and the other input is a clock input 104. The D flip-flop 100 has two outputs 106A, 106B labeled 'Q' and '$\overline{Q}$'. As shown from a truth-table 108 in FIG. 1B for the D flip-flop 100 in FIG. 1A, the D flip-flop 100 changes a signal on the output (Q) 106A to follow a signal on the control input 102 in response to the D flip-flop 100 being triggered by a clock signal CLK on the clock input 104. An active signal can be applied to the clock input 104 to put the D flip-flop 100 in a transparency mode to act as a simple latch such that a signal on the outputs 106A, 106B immediately changes in response to a change to the signal applied to the control input 102.

Conventional static random access memory (SRAM)-based cache is very fast, but it has low density and expensive costs. SRAM is also volatile memory, meaning that power is required retain a stored memory state. With the prevalence of mobile devices that use battery power to operate and the need to conserve power for extended operation, there is a desire to use non-volatile memory for memory storage. In this regard, magneto-resistive random access memory (MRAM) can be employed to provide data storage, such as in the D flip-flop 100 in FIG. 1A for example. MRAM is non-volatile memory in which data is stored by programming a magnetic tunnel junction (MTJ) as part of an MRAM bit cell. One advantage of MRAM is that MTJs in MRAM bit cells can retain stored information even when power is turned off, because data is stored in the MTJ as a small magnetic element rather than as an electric charge or current. Thus, during a standby or idle mode, power to MRAM can be turned completely off to conserve power without losing stored memory states. MRAM also has high density characteristics and non-volatile features, which can be used in computer memory designs.

Recent developments in MTJ devices involve spin-transfer torque (STT)-MRAM devices. For example, in STT-MRAM devices, the spin polarization of carrier electrons, rather than a pulse of a magnetic field, is used to program the state stored in the MTJ (i.e., a '0' or a '1'). In this regard, FIG. 2 illustrates an exemplary MRAM bit cell 200 that can be employed in a memory system or device, such as the D flip-flop 100 in FIG. 1A, to store or latch a memory state. The MRAM bit cell 200 includes a metal-oxide semiconductor (MOS) (typically N-type MOS, i.e., NMOS) access transistor 202 integrated with an MTJ 204 for storing non-volatile data. The MRAM bit cell 200 may be provided in an MRAM memory used as memory storage for any type of system requiring electronic memory, such as a central processing unit (CPU) or processor-based system, as examples. The MTJ 204 includes a pinned layer 206 and a free layer 208 disposed on either side of a tunnel barrier 210 formed by a thin non-magnetic dielectric layer. When the magnetic orientations of the pinned and free layers 206, 208 are anti-parallel (AP) to each other, a first memory state exists (e.g., a logical '1'). When the magnetic orientations of the pinned and free layers 206, 208 are parallel (P) to each other, a second memory state exists (e.g., a logical '0'). Further, the access transistor 202 controls reading and writing of data to the MTJ 204. A drain (D) of the access transistor 202 is coupled to a bottom electrode 212 of the MTJ 204, which is coupled to the pinned layer 206. A word line 214 is coupled to a gate G of the access transistor 202. A source (S) of the access transistor 202 is coupled to a source line 216, which is coupled to a write driver circuit 218. A bit line 220 is coupled to the write driver circuit 218 and a top electrode 222 of the MTJ 204, which is coupled to the free layer 208.

With continuing reference to FIG. 2, to read data from the MRAM bit cell 200, a voltage differential is applied between the source line 216 and the bit line 220. The gate G of the access transistor 202 is activated by activating the word line 214 to create a circuit with the write driver circuit 218 to cause a read current $I_R$ to flow through the MTJ 204. The voltage is applied between the source line 216 and the bit line 220 such that the direction of the read current $I_R$ flows from the free layer 208 to the pinned layer 206. The read current $I_R$ is sensed as an indication of the resistance of the MTJ 204 indicating whether the free layer 208 is in a P or AP magnetic orientation as compared to the pinned layer 206, and hence whether the MTJ 204 stores a logic '0' or '1' value. When writing data to the MTJ 204, a larger voltage differential is applied between the source line 216 and the bit line 220 by the write driver circuit 218, and the gate G of the access transistor 202 is activated by activating the word line 214. This causes a write current $I_W$ larger than the read current $I_R$ to flow through the MTJ 204. The write current $I_W$ must be strong enough to change the magnetic orientation of the free layer 208. If the magnetic orientation is to be changed from an AP to P magnetic orientation, the write current $I_W$ flowing from the top electrode 222 to the bottom electrode 212 induces STT at the free layer 208 that can change the magnetic orientation of the free layer 208 to P with respect to the pinned layer 206. If the magnetic orientation is to be changed from P to AP, a current flowing from the bottom electrode 212 to the top electrode 222 induces STT at the free layer 208 to change the magnetic orientation of the free layer 208 to AP with respect to the pinned layer 206.

FIG. 3A illustrate an exemplary non-volatile (NV) memory circuit 300 that includes a D flip-flop 302 and can include MTJs like the MTJ 204 in FIG. 2, to store an NV memory state. In this regard, the NV memory circuit 300 includes a master latch 304 that is configured to receive an input signal D on a data input 306 and a clock signal CLK on a clock signal input 308. The master latch 304 is configured to latch the value of the input signal D (e.g., a logical '0' or logical '1'). The D flip-flop 302 also includes a merged slave latch and sensing circuit 310 that is configured to latch the stored data in the master latch 304 in response to a rising edge of the clock signal CLK and generate an output Q with the latched data on a data output 312. FIG. 3B illustrates the slave latch and sensing circuit 310 in the D flip-flop 302 in FIG. 3A. As shown therein, the slave latch and sensing circuit 310 includes a slave latch 314 that includes cross-coupled P-type MOS (PMOS) and NMOS transistors $P_{L1}$, $P_{L2}$, $N_{L1}$, $N_{L2}$. In a normal operation mode, the slave latch 314 is configured to store the data latched in the master latch 304 on storage node $OUT_{SC1}$ and complement storage node $OUT_{SC2}$. A write circuit 316 is coupled to the storage node $OUT_{SC1}$ and complementary storage node $OUT_{SC2}$. The write circuit 316 is configured to store the memory states stored in the slave latch 314 on the storage node $OUT_{SC1}$ and complementary storage node $OUT_{SC2}$ to MTJs $MTJ_A$ and $MTJ_B$ as back-up storage in a back-up mode. In this manner, as shown in FIG. 3B, if a supply voltage $V_{DD}$ is reduced or collapsed in an idle mode to conserve power such that the stored memory states on the storage node $OUT_{SC1}$ and complementary storage node $OUT_{SC2}$ are lost, the stored memory states in the MTJs $MTJ_A$ and $MTJ_B$ can be restored and written back to the storage node $OUT_{SC1}$ and complementary storage node $OUT_{SC2}$ by a sensing circuit 318. In this manner, the NV memory circuit 300 is non-volatile. The sensing circuit 318 includes a sense enable transistor $N_S$; transistors $P_{P1}$, $P_{P2}$ are also included in the slave latch 314 and the sensing circuit 318 merged with the slave latch 314. The sensing circuit 318 is able to differentially sense a difference in the stored memory states in MTJs $MTJ_A$ and $MTJ_B$ for restoring the stored memory states in the slave latch 314. Providing a differential sensing method increases sensing margin to more accurately determine the stored memory states in the MTJs $MTJ_A$ and $MTJ_B$ to account for process variations therein and to reduce sensing sensitivity.

To further conserve active power in the NV memory circuit 300, it may be desired to reduce the supply voltage $V_{DD}$. For example, NV the memory circuit 300 may be included in a processor core along with other circuits that consume power in active modes. Thus, the supply voltage $V_{DD}$ may be lowered to near threshold voltage levels of transistors included in the NV memory circuit 300. However, as shown in a graph 400 in FIG. 4, as the supply voltage $V_{DD}$ is lowered to the NV memory circuit 300, the restore yield of the NV memory circuit 300 is also degraded. This is because as the supply voltage $V_{DD}$ scales down to near threshold voltage regions, it becomes more difficult to correctly read the stored data in the NV memory circuit 300 because of a decrease in supply voltage $V_{DD}$ and an increase in process variation. In other words, the successful rate of restoring the stored memory states from the MTJs $MTJ_A$ and $MTJ_B$ to the storage node $OUT_{SC1}$ and complementary storage node $OUT_{SC2}$ in the slave latch 314 on restoration of power in an active mode from a previous idle mode is reduced. As a result of operating the sensing circuit 318 at near threshold voltage levels, the sensing margin (i.e., the sensed difference in voltage levels as a way to sense difference in resistance in the MTJs $MTJ_A$ and $MTJ_B$) becomes less. Read current is reduced with reduced supply voltage $V_{DD}$. Thus, the difference in resistances between different stored memory states in the MTJs $MTJ_A$ and $MTJ_B$ will be reduced, thus reducing the sensing margin and making it more difficult to accurately sense the stored memory states in the MTJs $MTJ_A$ and $MTJ_B$ in the restore mode. Further, process variations in the MTJs $MTJ_A$ and $MTJ_B$ affect their resistances in response to stored magnetic states, which when combined with a reduced read current, can further reduce sensing margin.

The size of the transistors in the sensing circuit 318 of the D flip-flop 302 in FIGS. 3A and 3B can be increased to increase drive strength to increase read currents and to decrease the process variation of the threshold voltages, and thus improve sensing margin. Increasing the size of transistors in the sensing circuit 318 can be employed to offset the restoration degradation caused by reducing the supply voltage $V_{DD}$ to conserve active power. However, increasing transistor size in the D flip-flop 302 can cause performance degradation in an undesired manner, because increasing transistor length increases the capacitance of the transistor, thus increasing resistance-capacitance (RC) delay. For example, FIG. 5 illustrates a timing diagram 500 showing the timing of the generation of an output data signal Q of the D flip-flop 302 in FIG. 3A in response to a clock signal CLK and an input signal D. As shown therein, the performance of the D flip-flop 302 can be measured as a difference in time $t_{DQ}$ between the change in signal level of the input signal D at time $t_0$ and the generation of the output data signal Q at time $t_2$. Time $t_{DQ}$ is comprised of the time $t_{DC}$ between the change in signal level of the input signal D at time $t_0$ and the change in the clock signal CLK at time $t_1$, and time $t_{CQ}$ between the change in signal level of the clock signal CLK at time $t_1$ and the generation of the output data signal Q at time $t_2$. This performance degradation of the D flip-flop 302 in FIG. 3A as a function of the voltage level of the supply voltage $V_{DD}$ and transistor size in area is shown in a graph 600 in FIG. 6. As shown therein, as supply voltage $V_{DD}$ decreases and transistor size (shown on the Y-axis as AREA [$\mu m^2$]) increases to offset restoration degradation in the D flip-flop 302, the performance degradation shown on curve 602 decreases.

Thus, it is desired to provide a memory circuit, such as the NV memory circuit 302 in FIG. 3A, that is non-volatile to be able to retain a memory state when power is reduced or collapsed during idle modes to conserve idle power, and can operate at reduced voltage levels during active modes to conserve active power without suffering from restoration and performance degradations.

SUMMARY OF THE DISCLOSURE

Aspects disclosed in the detailed description include offset-cancellation sensing circuit (OCSC)-based non-volatile (NV) memory circuits. For example, the OCSC-based NV memory circuit may include a flip-flop. The OCSC-based NV memory circuit includes a latch circuit configured to latch (i.e., store) a memory state based on a memory state represented by an input data signal. The OCSC-based NV memory circuit also includes a write circuit that is configured to store the latch memory state in the latch circuit, to NV memory devices in the latch circuit. When power is restored after being reduced or collapsed in an idle mode, a sensing circuit is configured to amplify a differential voltage representing stored memory states in the NV memory devices to restore the stored memory states in the latch circuit. In this manner, the OCSC-based NV memory circuit has non-volatile functionality that will retain its memory state after power is reduced or collapsed in an idle mode to reduce idle mode power consumption.

In further exemplary aspects disclosed herein, to also reduce power consumption in an active mode, the OCSC-based NV memory circuit is configured to be operated at a reduced power level to reduce power consumption during an active mode. In this regard, the sensing circuit in the OCSC-based NV memory circuit is provided as a separate circuit that does not share transistors with the latch circuit in the OCSC-based NV memory circuit. In this manner, the capacitance of the transistors in the sensing circuit does not affect the capacitance of the transistors in the latch circuit. The capacitance of the transistors in the latch circuit affects the throughput timing performance of the latch circuit defined as the time between receiving an input data signal and generation of a resulting output signal from latched data representing the memory state of the input data signal. Further, in additional aspects disclosed herein, to avoid the need to increase the transistor size in the sensing circuit, if desired, to offset or mitigate restoration degradation in restoring the stored memory state to the latch circuits due to decreased sensing margin when operating at a lower voltage level in active mode, the sensing circuit in the OCSC-based NV memory circuit is configured to cancel an offset voltage of a differential amplifier in the sensing circuit. In this regard, the sensing circuit is configured to pre-charge gates of its differential transistors in the differential amplifier to their respective threshold voltages before sensing the memory states stored in the NV memory devices to cancel out the offset voltage of the differential amplifier. The gates of the differential transistors are further configured to receive the input voltages representing the memory states stored in respective NV memory devices in voltage capture phases after pre-charging the gates of the differential transistors for amplifying the sensed differential voltage levels to restore the latched memory state in the latch circuit. Further, in other exemplary aspects disclosed herein, the NV memory devices are provided in the sensing circuit and coupled to the differential transistors as N-type metal-oxide semiconductor (MOS) (NMOS) transistors in the differential amplifier. What would otherwise be additional pull-up P-type MOS (PMOS) differential transistors included in the differential amplifier and coupled to the differential NMOS transistors are replaced by the NV memory devices. Thus, this exemplary design aspect in the sensing circuit makes it unnecessary to cancel the offset voltage of additional differential PMOS transistors in the differential amplifier that are not included.

In this regard in one aspect, a sensing circuit is provided. The sensing circuit comprises a differential amplifier. The differential amplifier comprises an output node configured to receive an output voltage. The differential amplifier also comprises a complement output node configured to receive a complement output voltage. The differential amplifier also comprises a differential transistor comprising a first gate, a first node, and a second node coupled to a ground node. The differential amplifier also comprises a complement differential transistor comprising a second gate, a third node, and a fourth node coupled to the ground node. The differential amplifier also comprises a pre-charge control circuit coupled between the first gate and the complement output node, the pre-charge control circuit configured to be activated to couple the first gate to the output node. The differential amplifier also comprises a complement pre-charge control circuit coupled between the second gate and the output node, the complement pre-charge control circuit configured to be activated to couple the second gate to the complement output node. The differential amplifier also comprises a ground control circuit coupled between the ground node and a capacitor node. The differential amplifier also comprises a complement ground control circuit coupled between the ground node and a complement capacitor node. The differential amplifier also comprises a capacitor circuit coupled between the first gate and the capacitor node. The differential amplifier also comprises a complement capacitor circuit coupled between the second gate and the complement capacitor node. The sensing circuit also comprises an NV memory circuit coupled between the complement output node and a supply node, the NV memory circuit configured to store a memory state. The sensing circuit also comprises a complement NV memory circuit coupled between the output node and the supply node, the complement NV memory circuit configured to store a complement memory state complementary to the memory state. The sensing circuit also comprises a differential amplifier control circuit coupled to a supply voltage node configured to receive a supply voltage and the supply node.

In another aspect, a sensing circuit is provided. The sensing circuit comprises a means for pre-charging a gate of a differential transistor to a pre-charge voltage based on a supply voltage coupled to a supply node, the differential transistor coupled between an NV memory circuit and a ground node, and a means for pre-charging a gate of a complement differential transistor to a complement pre-charge voltage based on the supply voltage coupled to the supply node, the complement differential transistor coupled between a complement NV memory circuit and the ground node. The sensing circuit also comprises a means for pre-charging a capacitor circuit coupled between the gate of the differential transistor and the ground node based on the pre-charge voltage applied to the gate of the differential transistor, and a means for pre-charging a complement capacitor circuit coupled between the gate of the complement differential transistor and the ground node based on the complement pre-charge voltage applied to the gate of the complement differential transistor. The sensing circuit also comprises a means for discharging the capacitor circuit onto the gate of the differential transistor to couple the NV memory circuit to the ground node to discharge the pre-charge voltage on the gate of the differential transistor to a threshold voltage of the differential transistor, and a means for discharging the complement capacitor circuit onto the gate of the complement differential transistor to couple the complement NV memory circuit to the ground node to discharge the complement pre-charge voltage on the gate of the complement differential transistor to a complement threshold voltage of the complement differential transistor, to substantially cancel offset voltages of the differential transistor and the complement differential transistor. The sensing circuit also comprises a means for pre-charging an output node to a ground voltage on the ground node coupled to the complement NV memory circuit, and a means for pre-charging a complement output node to the ground voltage on the ground node coupled to the NV memory circuit. The sensing circuit also comprises a means for applying the supply voltage to the NV memory circuit to generate a read current through the NV memory circuit based on a resistance of the NV memory circuit to generate a complement output voltage on the complement output node to activate the complement differential transistor, and a means for applying the supply voltage to the complement NV memory circuit to generate a complement read current through the complement NV memory circuit based on a resistance of the complement NV memory circuit to generate the output voltage on the output node to activate the differential transistor, such that the output voltage on the output node represents a difference in resistance between the NV memory circuit and the complement NV memory circuit, wherein the complement output voltage on the complement output node represents a difference in resistance between the complement NV memory circuit and the NV memory circuit.

In another aspect, a method of sensing a differential voltage based on a difference in stored memory states in an NV memory circuit and a complement NV memory circuit is provided. The method comprises pre-charging a first gate of a differential transistor to a pre-charge voltage based on a supply voltage coupled to a supply node, the differential transistor coupled between an NV memory circuit and a ground node, and pre-charging a second gate of a complement differential transistor to a complement pre-charge voltage based on the supply voltage coupled to the supply node, the complement differential transistor coupled between a complement NV memory circuit and the ground node. The method also comprises pre-charging a capacitor circuit coupled between the first gate of the differential transistor and the ground node based on the pre-charge voltage applied to the gate of the differential transistor, and pre-charging a complement capacitor circuit coupled between the second gate of the complement differential transistor and the ground node based on the complement pre-charge voltage applied to the second gate of the complement differential transistor. The method comprises discharging the capacitor circuit onto the first gate of the differential transistor to couple the NV memory circuit to the ground node to discharge the pre-charge voltage on the first gate of the differential transistor to a threshold voltage of the differential transistor, and discharging the complement capacitor circuit onto the second gate of the complement differential transistor to couple the complement NV memory circuit to the ground node to discharge the complement pre-charge voltage on the second gate of the complement differential transistor to a complement threshold voltage of the complement differential transistor, to substantially cancel offset voltages of the differential transistor and the complement differential transistor. The method comprises pre-charging an output node to a ground voltage on the ground node coupled to the complement NV memory circuit, and pre-charging a complement output node to the ground voltage on the ground node coupled to the NV memory circuit. The method comprises applying the supply voltage to the NV memory circuit to generate a read current to flow through the NV memory circuit based on a resistance of the NV memory circuit to generate a complement output voltage on the complement output node to activate the complement differential transistor, and applying the supply voltage to the complement NV memory circuit to generate a complement read current to flow through the complement NV memory circuit based on a resistance of the complement NV memory circuit to generate an output voltage on the output node to activate the differential transistor, such that the output voltage on the output node represents a difference in resistance between the NV memory circuit and the complement NV memory circuit, the complement output voltage on the complement output node represents a difference in resistance between the complement NV memory circuit and the NV memory circuit.

In another aspect, an NV memory circuit is provided. The NV memory circuit comprises a latch circuit. The latch circuit comprises a latch input configured to receive a latch input data signal. The latch circuit also comprises a latch output. The latch circuit is configured to latch input data based on the received latch input data signal and generate an output data signal on the latch input based on the latch input data. The NV memory circuit also comprises a sensing circuit. The sensing circuit comprises a differential amplifier. The differential amplifier comprises an output node configured to receive an output voltage. The differential amplifier also comprises a complement output node configured to receive a complement output voltage. The differential amplifier also comprises a differential transistor comprising a first gate, a first node, and a second node coupled to a ground node. The differential amplifier also comprises a complement differential transistor comprising a second gate, a third node, and a fourth node coupled to the ground node. The differential amplifier also comprises a pre-charge control circuit coupled between the first gate and the output node, the pre-charge control circuit configured to be activated to couple the first gate to the output node. The differential amplifier also comprises a complement pre-charge control circuit coupled between the second gate and the complement output node, the complement pre-charge control circuit configured to be activated to couple the second gate to the complement output node. The differential amplifier also comprises a ground control circuit coupled between the ground node and a capacitor node. The differential amplifier also comprises a complement ground control circuit coupled between the ground node and a complement capacitor node. The differential amplifier also comprises a capacitor circuit coupled between the first gate and the capacitor node. The differential amplifier also comprises a complement capacitor circuit coupled between the second gate and the complement capacitor node. The sensing circuit also comprises the NV memory circuit coupled between the complement output node and a supply node, the NV memory circuit configured to store a memory state. The sensing circuit also comprises a complement NV memory circuit coupled between the output node and the supply node, the complement NV memory circuit configured to store a complement memory state complementary to the memory state. The sensing circuit also comprises a differential amplifier control circuit coupled to a supply voltage node configured to receive a supply voltage and the supply node. The NV memory circuit also comprises a write circuit coupled to the latch output, the output node, and the complement output node, configured to receive the latch input data. The write circuit is configured to write the latch output to the output node to be stored in the NV memory circuit, and write a complement latch output complementary to the latch output to the complement output node to be stored in the complement NV memory circuit.

BRIEF DESCRIPTION OF THE FIGURES

FIG. 9A-1 illustrates a pre-charge operational phase of the sensing circuit and a write circuit in the OCSC-based NV memory circuit in FIG. 8A to pre-charge gates of differential transistors in a differential amplifier;

FIG. 9A-2 is a timing diagram illustrating signal levels for a pre-charge operational phase of the sensing circuit in the OCSC-based NV memory circuit in FIG. 9A-1;

FIG. 9B-1 illustrates an offset-cancellation operational phase of the sensing circuit and write circuit in the OCSC-based NV memory circuit in FIG. 8A for cancelling an offset voltage of a differential amplifier;

FIG. 9B-2 is a timing diagram illustrating signal levels for the offset-cancellation operational phase of the sensing circuit in the OCSC-based NV memory circuit in FIG. 9B-1;

FIG. 9C-1 illustrates a second pre-charge operational phase of the sensing circuit and write circuit in the OCSC-based NV memory circuit in FIG. 8A to pre-charge output nodes of the sensing circuit;

FIG. 9C-2 is a timing diagram illustrating signal levels for the second pre-charge operational phase of the sensing circuit in the OCSC-based NV memory circuit in FIG. 9C-1;

FIG. 9D-1 illustrates a comparison operational phase of the sensing circuit and write circuit in the OCSC-based NV memory circuit in FIG. 8A to generate an output voltage on an output node representing a memory state stored in the NV memory devices;

FIG. 9D-2 is a timing diagram illustrating signal levels for the comparison operational phase of the sensing circuit in the OCSC-based NV memory circuit in FIG. 9D-1;

DETAILED DESCRIPTION

Figures 1A, 1B:
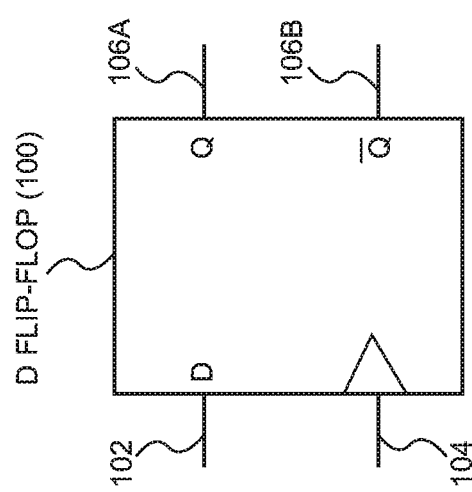
FIG. 1A is a schematic diagram of an exemplary D flip-flop.
FIG. 1B is a truth table for the D flip-flop in FIG. 1A.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include offset-cancellation sensing circuit (OCSC)-based non-volatile (NV) memory circuits. For example, the OCSC-based NV memory circuit may include a flip-flop. The OCSC-based NV memory circuit includes a latch circuit configured to latch (i.e., store) a memory state based on a memory state represented by an input data signal. The OCSC-based NV memory circuit also includes a write circuit that is configured to store the latch memory state in the latch circuit, to NV memory devices in the latch circuit. When power is restored after being reduced or collapsed in an idle mode, the sensing circuit is configured to amplify a differential voltage representing stored memory states in the NV memory devices to restore the stored memory states in the latch circuit. In this manner, the OCSC-based NV memory circuit has non-volatile functionality that will retain its memory state after power is reduced or collapsed in an idle mode to reduce idle mode power consumption.

In further exemplary aspects disclosed herein, to also reduce power consumption in an active mode, the OCSC-based NV memory circuit is configured to be operated at a reduced power level to reduce power consumption during an active mode. In this regard, the sensing circuit in the OCSC-based NV memory circuit is provided as a separate circuit that does not share transistors with the latch circuit in the OCSC-based NV memory circuit. In this manner, the capacitance of the transistors in the sensing circuit does not affect the capacitance of the transistors in the latch circuit. The capacitance of the transistors in the latch circuit affects the throughput timing performance of the latch circuit defined as the time between receiving an input data signal and generation of a resulting output signal from latched data representing the memory state of the input data signal. Further, in additional aspects disclosed herein, to avoid the need to increase the transistor size in the sensing circuit, if desired, to offset or mitigate restoration degradation in restoring the stored memory state to the latch circuits due to decreased sensing margin when operating at a lower voltage level in active mode, the sensing circuit in the OCSC-based NV memory circuit is configured to cancel an offset voltage of a differential amplifier in the sensing circuit. In this regard, the sensing circuit is configured to pre-charge gates of its differential transistors in the differential amplifier to their respective threshold voltages before sensing the memory states stored in the NV memory devices to cancel out the offset voltage of the differential amplifier. The gates of the differential transistors are further configured to receive the input voltages representing the memory states stored in respective NV memory devices in voltage capture phases after pre-charging the gates of the differential transistors for amplifying the sensed differential voltage levels to restore the latched memory state in the latch circuit. Further, in other exemplary aspects disclosed herein, the NV memory devices are provided in the sensing circuit and coupled to the differential transistors as N-type metal-oxide semiconductor (MOS) (NMOS) transistors in the differential amplifier. What would otherwise be additional pull-up P-type MOS (PMOS) differential transistors included in the differential amplifier and coupled to the differential NMOS transistors are replaced by the NV memory devices. Thus, this exemplary design aspect in the sensing circuit makes it unnecessary to cancel the offset voltage of additional differential PMOS transistors in the differential amplifier that are not included.

Figure 7A:
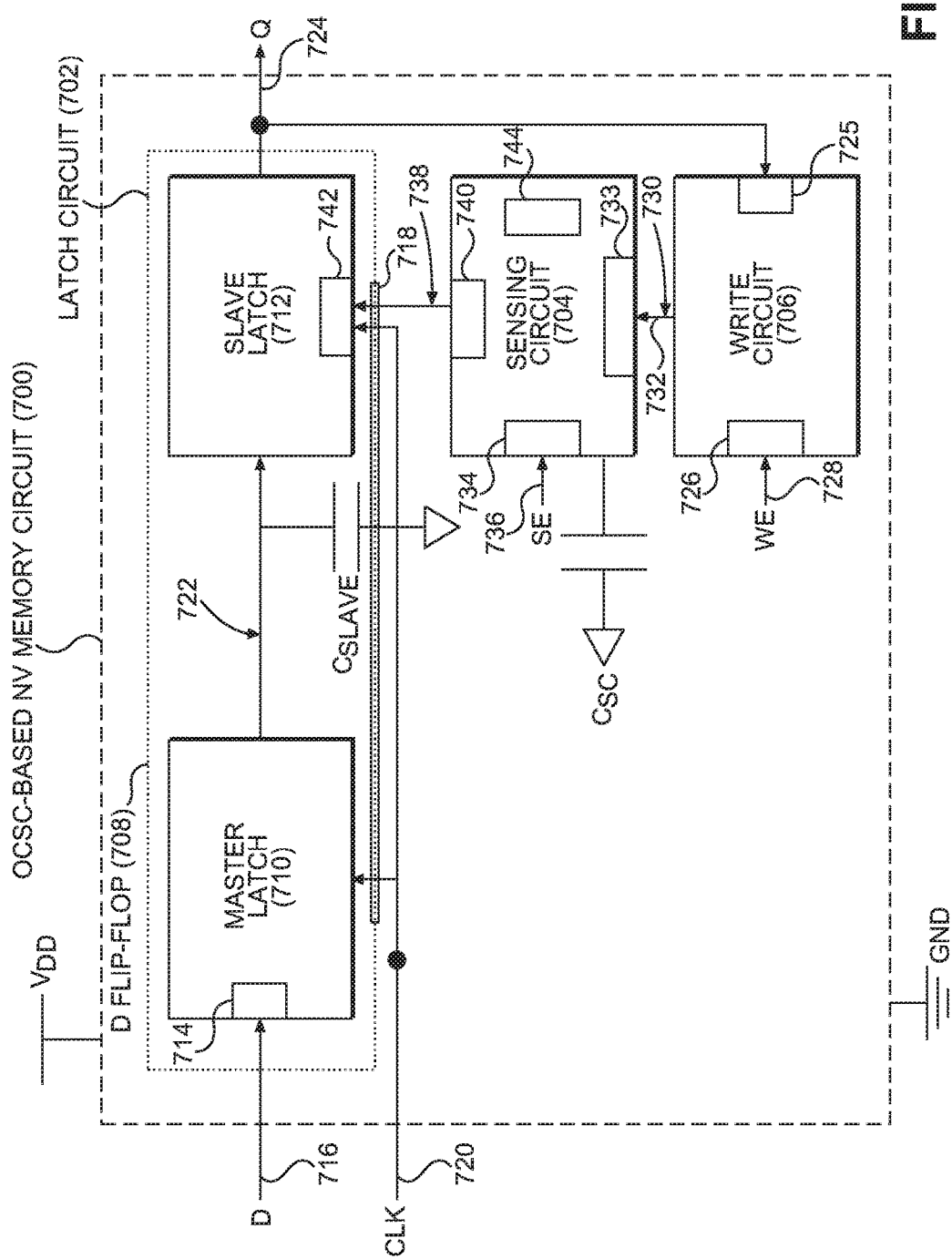
FIG. 7A is a block diagram of an exemplary NV offset-cancellation sensing circuit (OCSC)-based memory circuit that includes a latch circuit and a sensing circuit that includes NV memory devices configured to store a memory state of latched data in the latch circuit to allow such data to be restored in the latch circuit when recovering from a power reduction or collapse in an idle mode, wherein the sensing circuit is also configured to cancel an offset voltage of differential transistors in a differential amplifier used to sense a stored memory state to avoid or reduce restoration degradation otherwise attributed to operating at a lower voltage level in an active mode to conserve power.

In this regard, FIG. 7A is a block diagram of an exemplary OCSC-based NV memory circuit 700 that includes a latch circuit 702, and a separate sensing circuit 704 and write circuit 706. The latch circuit 702 is a D flip-flop 708 in this example that includes a master latch 710 and a slave latch 712. The master latch 710 is configured to receive an input data signal D received on a data input 714 from a data line 716 coupled to a latch input 717. The master latch 710 is configured to latch (i.e., store) a memory state (e.g., a logical '0' or '1') representative of a voltage level of the input data signal D in the master latch 710 from another circuit clocked by clock signal CLK. The slave latch 712 is configured to receive a signal 722 representative of the latched memory state of the input data signal D in the master latch 710 and latch a memory state representing the logical state of the signal 722 in response to a rising edge of the clock signal CLK received on a clock signal input 718 from a clock line 720. The slave latch 712 is configured to generate an output data signal Q on a latch output 724 representing the stored memory state of the clock signal input 718 latched in the slave latch 712.

As will be discussed in more detail below, the sensing circuit 704 and write circuit 706 in the OCSC-based NV memory circuit 700 are provided to back-up the latched memory states in the latch circuit 702 and to restore such backed-up memory states in a restore mode such that the OCSC-based NV memory circuit 700 is an NV memory device. In this regard, the write circuit 706 is coupled to the D flip-flop 708 and configured to receive the output data signal Q from the D flip-flop 708 on a write input 725. In response to a write enable signal WE received on a write enable input 726 on a write enable line 728, the write circuit 706 is configured to generate a write data signal 730 on a write data signal line 732 representing the memory state of the output data signal Q to the sensing circuit 704. This causes the write circuit 706 to back-up the latched output data signal Q from the D flip-flop 708 in an NV memory 733 included in the sensing circuit 704. As will be discussed in more detail below, the sensing circuit 704 includes the NV memory 733 configured to store a data signal representing the memory state of the write data signal 730 representing the memory state of the output data signal Q. In this regard, when the voltage level of a supply voltage $V_{DD}$ to the OCSC-based NV memory circuit 700 is collapsed or reduced below a minimum operating voltage for the D flip-flop 708 to retain the stored memory state representing the memory state of the signal 722 in an idle mode or state to conserve power, the sensing circuit 704 can be activated to sense and generate a data signal representing the stored memory state in the NV memory 733 to the slave latch 712 to restore the stored memory state in the slave latch 712. For example, the sensing circuit 704 may include a differential amplifier 744 to sense the stored memory state in the NV memory 733. In this manner, the slave latch 712 can restore its operation by generating the output data signal Q on the latch output 724 when operation resumes in an active mode. As shown in FIG. 7A, the sensing circuit 704 has a sense enable input 734 that is configured to receive a sense enable signal SE on a sense enable line 736. The sensing circuit 704 is configured to generate a data signal 738 on a data output 740 to be received by a write data input 742 in the slave latch 712 in response to the sense enable signal SE indicating a sense enable state.

Figures 3A, 3B:
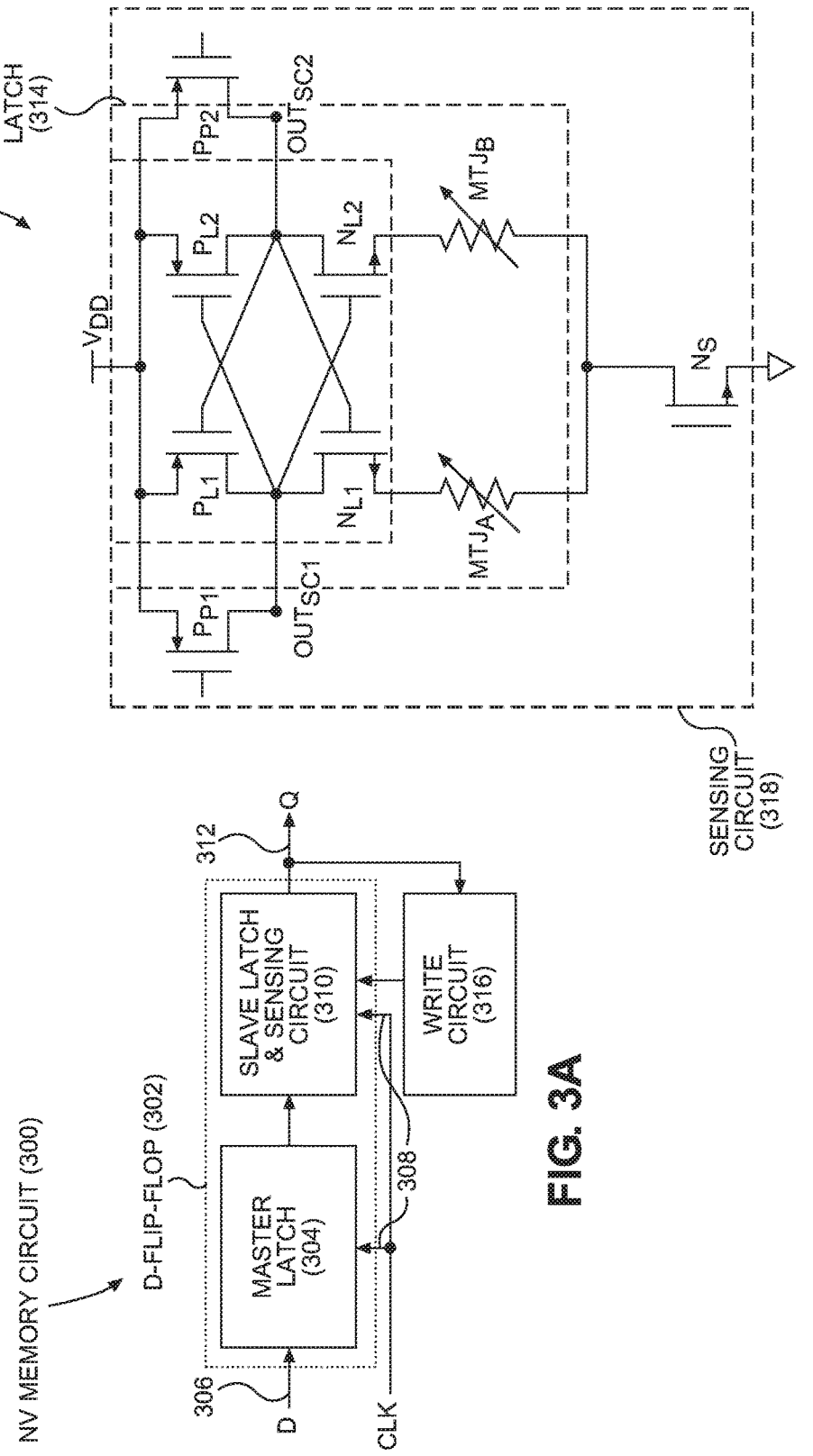
FIG. 3A is a block diagram of a non-volatile (NV) memory circuit that includes a D flip-flop that employs a merged slave latch and sensing circuit to provide a merged latch and sensing circuit structure.
FIG. 3B is a circuit diagram of a slave latch in the D flip-flop in FIG. 3A.
Figure 4:
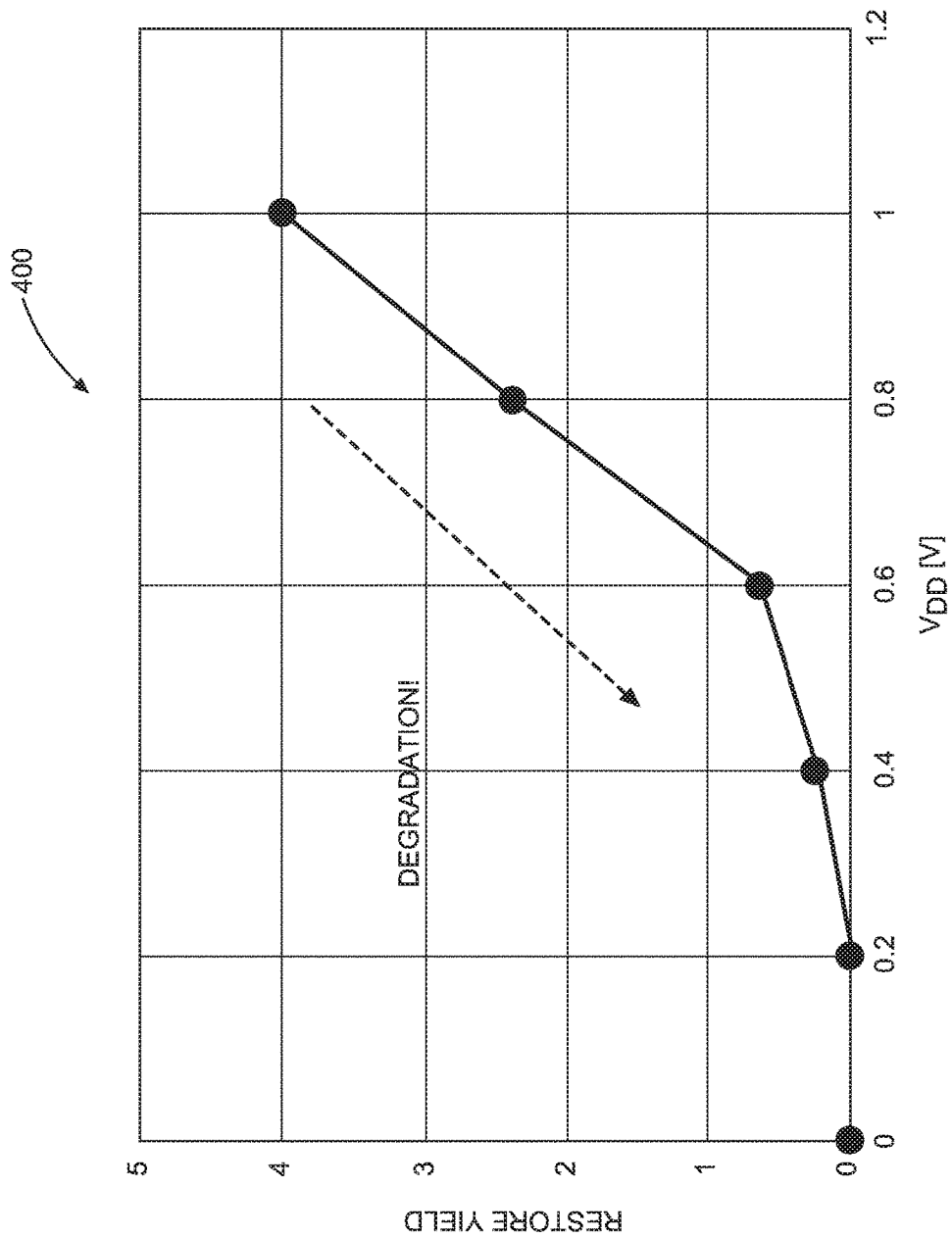
FIG. 4 is a graph illustrating restore yield degradation in the D flip-flop in FIG. 3A as a function of supply voltage.
Figure 5:
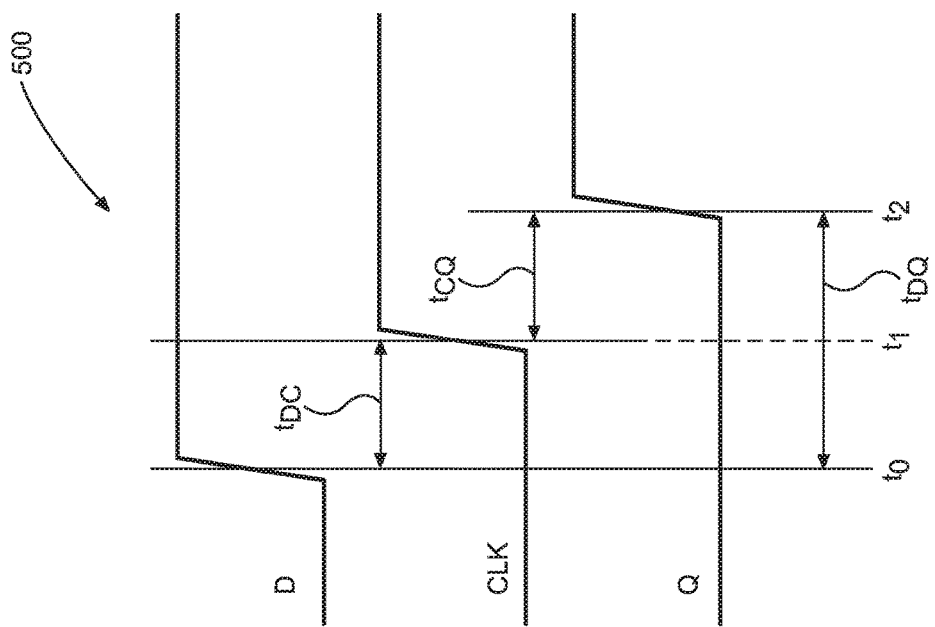
FIG. 5 is a timing diagram illustrating delay in the D flip-flop in FIG. 3A.
Figure 6:
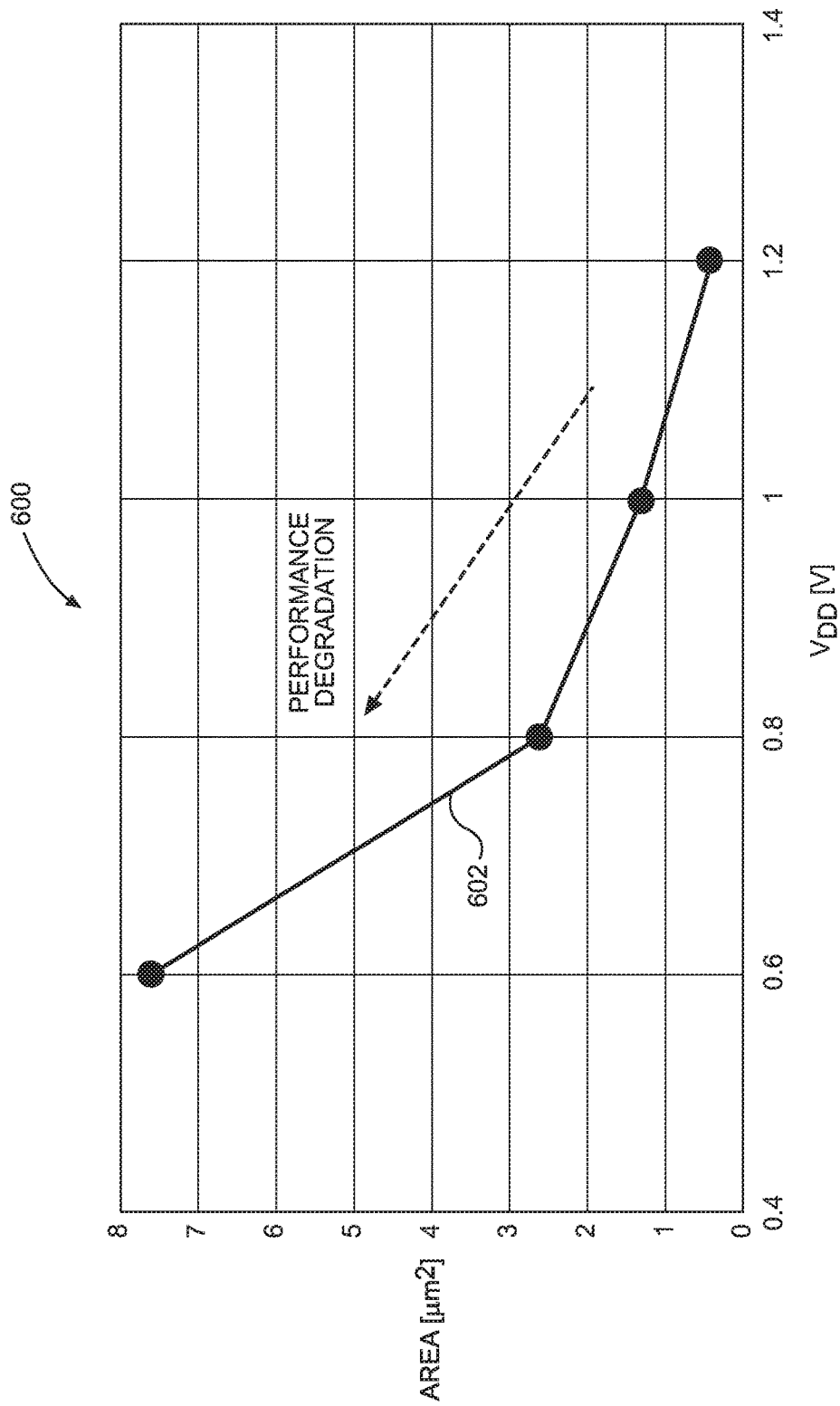
FIG. 6 is a graph illustrating performance degradation in the D flip-flop in FIG. 3A as a function of supply voltage and transistor area in the slave latch and sensing circuit.
Figure 7B:
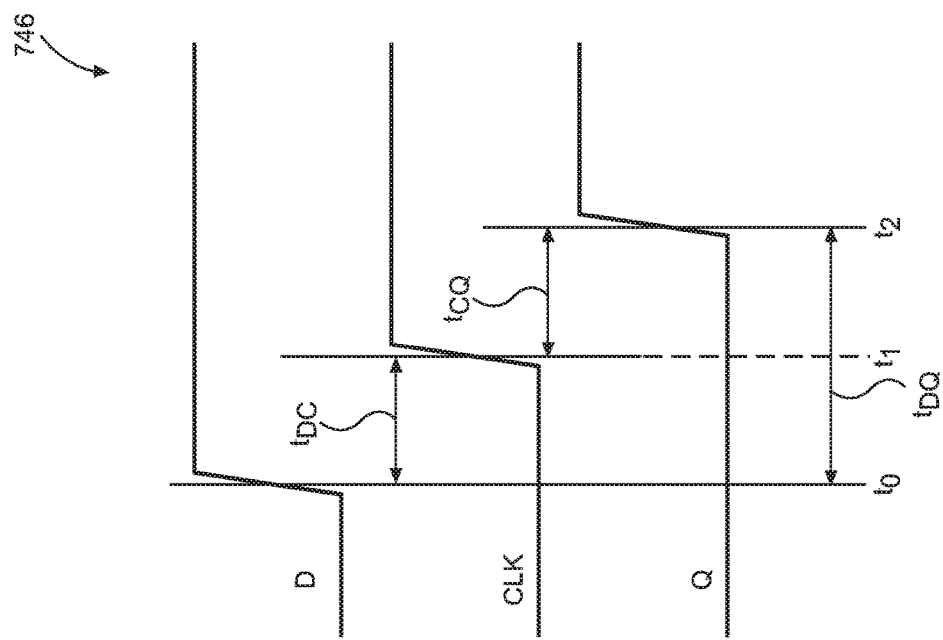
FIG. 7B is a timing diagram illustrating an exemplary timing of signals of the latch circuit in FIG. 7A.

Also, as shown in FIG. 7A, the sensing circuit 704 in the OCSC-based NV memory circuit 700 is provided as a separate circuit from the latch circuit 702 (the D flip-flop 708 in this example), meaning that a sense amplifier does not share transistors with the latch circuit 702. In this manner, a capacitance $C_{SC}$ in the sensing circuit 704 does not affect a capacitance $C_{SLAVE}$ the of the slave latch 712 in the D flip-flop 708. The capacitance $C_{SLAVE}$ of the slave latch 712 affects throughput timing performance of the D flip-flop 708. As shown in a timing diagram 746 in FIG. 7B, the throughput timing performance of the D flip-flop 708 is defined as a time $t_{DQ}$ between time $t_0$ receiving the input data signal D and generation of a resulting output data signal Q at time $t_2$. Time $t_{DQ}$ is comprised of the time $t_{DC}$ between the change in signal level of the input data signal D at time $t_0$ and the change in a clock signal CLK at time $t_1$, and time $t_{CQ}$ between the change in signal level of the clock signal CLK at time $t_1$ and the generation of the output data signal Q at time $t_2$. This performance degradation of the D flip-flop 302 in FIG. 3A as a function of the voltage level of the supply voltage $V_{DD}$ and transistor size in area is shown in the graph 600 in FIG. 6. As shown therein, as supply voltage $V_{DD}$ decreases and transistor size increases to offset restoration degradation in the D flip-flop 302, the performance degradation shown on the curve 602 decreases.

With reference back to FIG. 7A, it may also be desired to reduce active power consumption by the OCSC-based NV memory circuit 700 during active modes when the supply voltage $V_{DD}$ is not reduced or collapsed during an idle mode. In this regard, it may be desired to reduce the voltage level of the supply voltage $V_{DD}$ to a near threshold voltage level of the electronic devices (e.g., transistors) in the OCSC-based NV memory circuit 700 to conserve power, but the voltage level of the supply voltage $V_{DD}$ may still be at or above a minimum operating voltage of the electronic devices in the OCSC-based NV memory circuit 700. For example, if the threshold voltage level of the electronic devices in the OCSC-based NV memory circuit 700 is 0.7 Volts (V), and the non-reduced, nominal operating voltage level of the supply voltage $V_{DD}$ is 1.0 V, it may be desired to reduce the voltage level of the supply voltage $V_{DD}$ to 0.8 V or even 0.7 V. However, the timing performance of the D flip-flop 708 in FIG. 7A is a function of the voltage level of the supply voltage $V_{DD}$. As the voltage level of the supply voltage $V_{DD}$ decreases, the timing performance of the D flip-flop 708 degrades for example. Also, the sensing margin of the sensing circuit 704 may be reduced with a lower supply voltage $V_{DD}$, resulting in a reduced sensing sensitivity, thus reducing the accuracy when sensing the memory state of the stored data in the NV memory 733 upon restoration when changing from an idle mode to an active mode. A decrease in process variation of the transistors in the sensing circuit 704 will decrease the variation in the threshold voltages of the transistors to improve yield. Increasing the size of transistors in the sensing circuit 704 can improve yield because of the decrease in the process variation of threshold voltages and the increase in the drive strength. However, if the sensing circuit 704 were merged with the slave latch 712, this increase in transistor size in the sensing circuit 704 would degrade performance of the slave latch 712 and thus the D flip-flop 708. Increasing transistor size increases the capacitance of a transistor thus increasing resistance-capacitance (RC) delay. Thus, the sensing circuit 704 is provided as a separate sensing circuit 704 from the slave latch 712 in the OCSC-based NV memory circuit 700 in FIG. 7A.

Still, it may be undesired to increase the size of transistors in the sensing circuit 704 because of the resulting increase in area of the OCSC-based NV memory circuit 700 in FIG. 7A. For example, an increase in area of the OCSC-based NV memory circuit 700 may come at a high price, because the OCSC-based NV memory circuit 700 may be a common circuit that is repeated through an integrated circuit (IC). Further, the OCSC-based NV memory circuit 700 may be included in a processing core for example to provide an NV memory device where it is highly desired to reduce area. Thus, as will also be discussed in more detail below, to offset or mitigate restoration degradation in restoring the stored memory state in the NV memory 733 of the sensing circuit 704 due to decreased sensing margin when operating a reduced supply voltage $V_{DD}$ level in active mode, the sensing circuit 704 in the OCSC-based NV memory circuit 700 in FIG. 7A is further configured to cancel an offset voltage of the differential amplifier 744 included in the sensing circuit 704.

In this regard, the sensing circuit 704 is configured to pre-charge gates of its differential transistors in the differential amplifier 744 to their respective threshold voltages before sensing the memory states stored in the NV memory devices to cancel out the offset voltage of the differential amplifier 744. The gates of the differential transistors are further configured to receive the input voltages representing the memory states stored in respective NV memory devices in voltage capture phases after pre-charging the gates of the differential transistors for amplifying the sensed differential voltage levels to restore the latched memory state in the latch circuit 702. Further, in other exemplary aspects disclosed herein, the NV memory devices are provided in the sensing circuit 704 and coupled to the differential transistors as NMOS transistors in the differential amplifier 744. What would otherwise be additional pull-up PMOS differential transistors included in the differential amplifier 744 and coupled to the differential NMOS transistors are replaced by the NV memory devices. Thus, this exemplary design aspect in the sensing circuit 704 makes it unnecessary to cancel the offset voltage of additional differential PMOS transistors in the differential amplifier 744 that are not included.

Figure 8A:
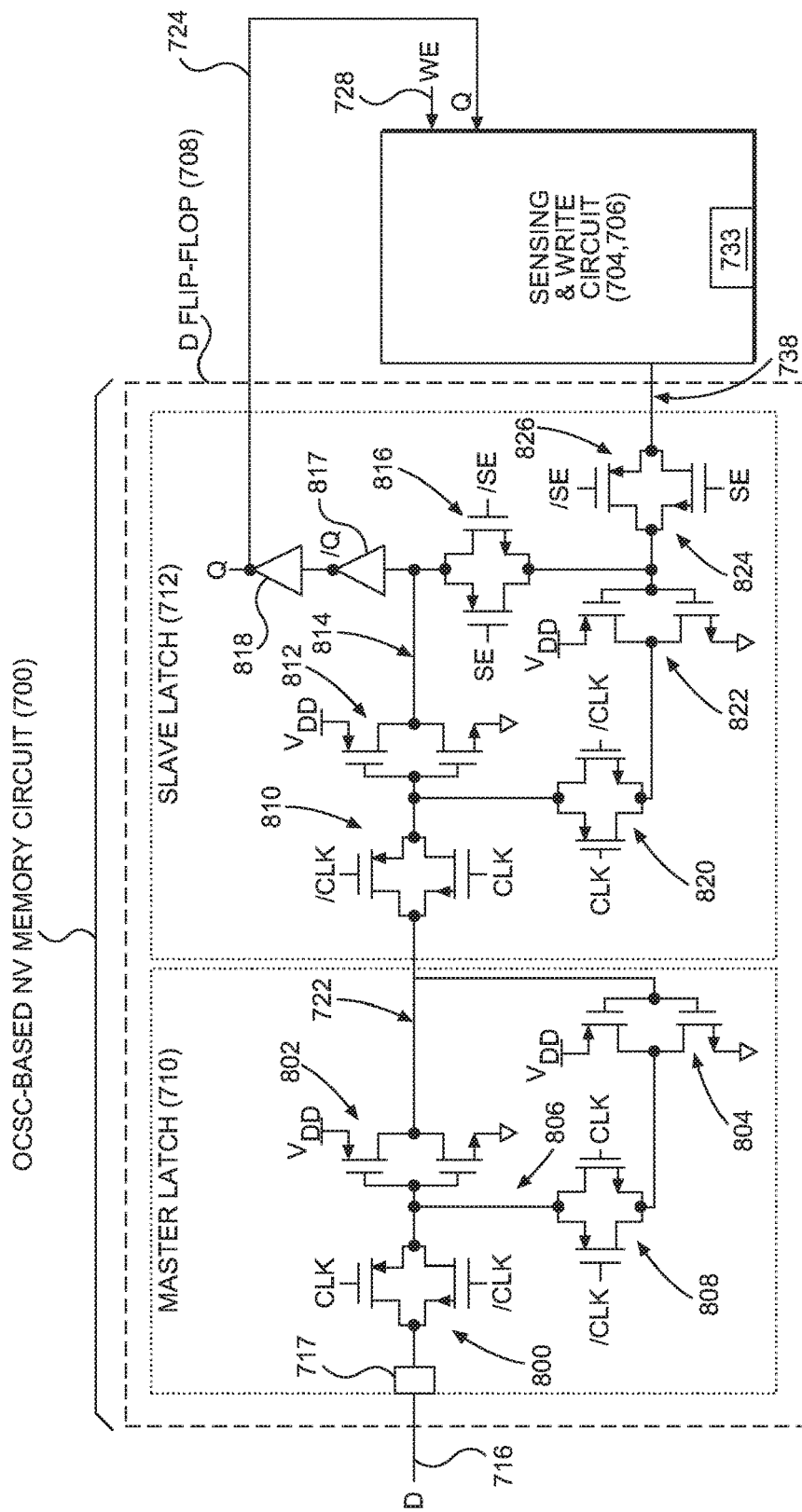
FIG. 8A is an exemplary, more detailed circuit diagram of the OCSC-based NV memory circuit in FIGS. 7A and 7B.

FIG. 8A is an exemplary, more detailed circuit diagram of the OCSC-based NV memory circuit 700 in FIG. 7A. Common components are shown with common element numbers between FIGS. 8A and 7A. As shown in FIG. 8A, the OCSC-based NV memory circuit 700 includes the D flip-flop 708 that includes the master latch 710 and the slave latch 712. The D flip-flop 708 is coupled to the write circuit 706. The sensing circuit 704 and write circuit 706 are shown as a combined element in FIG. 8A, but do not have to be a combined circuit. The master latch 710 includes a pass gate 800 that passes the input data signal D in response to the rising and falling edge of the clock signal CLK. An inverter 802 receives the input data signal D when passed by the pass gate 800 and inverts the input data signal D as the signal 722. Signal 722 is coupled to another inverter 804 that generates an inverted data signal 806 of the input data signal D passed by a pass gate 808 as a feedback to the inverter 802. Thus, outputs of the inverters 802, 804 are reinforced to store a memory state representing the input data signal D as the signal 722 as long as the supply voltage $V_{DD}$ is at a sufficient voltage level for the inverters 802, 804 to operate. The signal 722 is also coupled to a pass gate 810 in the slave latch 712 that passes the signal 722 in response to the clock signal CLK. Again, similar to that of the master latch 710, the slave latch 712 includes an inverter 812 that receives the signal 722 when passed by the pass gate 810 and inverts the signal 722 as an inverted signal 814. Inverted signal 814 is coupled to inverters 817, 818 to provide an output data signal Q. The passed signal 722 is also coupled from the pass gate 810 to another pass gate 820 that is controlled by the clock signal CLK to pass the signal 722 to another inverter 822 to generate an inverted signal 824. Another pass gate 826 passes the inverted signal 824 in response to a sense enable signal SE being in a sense enable state or sense disable state. When the sense enable signal SE is in a sense disable state, the inverted signal 824 is passed by the pass gate 826 to the write circuit 706 to be written by the write circuit 706 to the NV memory circuit 827 in the NV memory 733 (see FIG. 7A) in the sensing circuit 704. This is so the memory state of the signal 722 is stored in the NV memory 733 in case the memory state of the latch circuit 702 needs to be restored in active mode after a power cycle or reduction in voltage in the supply voltage $V_{DD}$ in an idle or sleep mode. However, when the sense enable signal SE is in a sense enable state, such as after a restoration of the supply voltage $V_{DD}$ after a previous idle or sleep operational phase, the sensing circuit 704 is configured to supply the signal 722 to the slave latch 712 to be passed by the pass gate 826 to the inverter 822 and the pass gate 820 to restore the memory state of the slave latch 712.

Figure 8B:
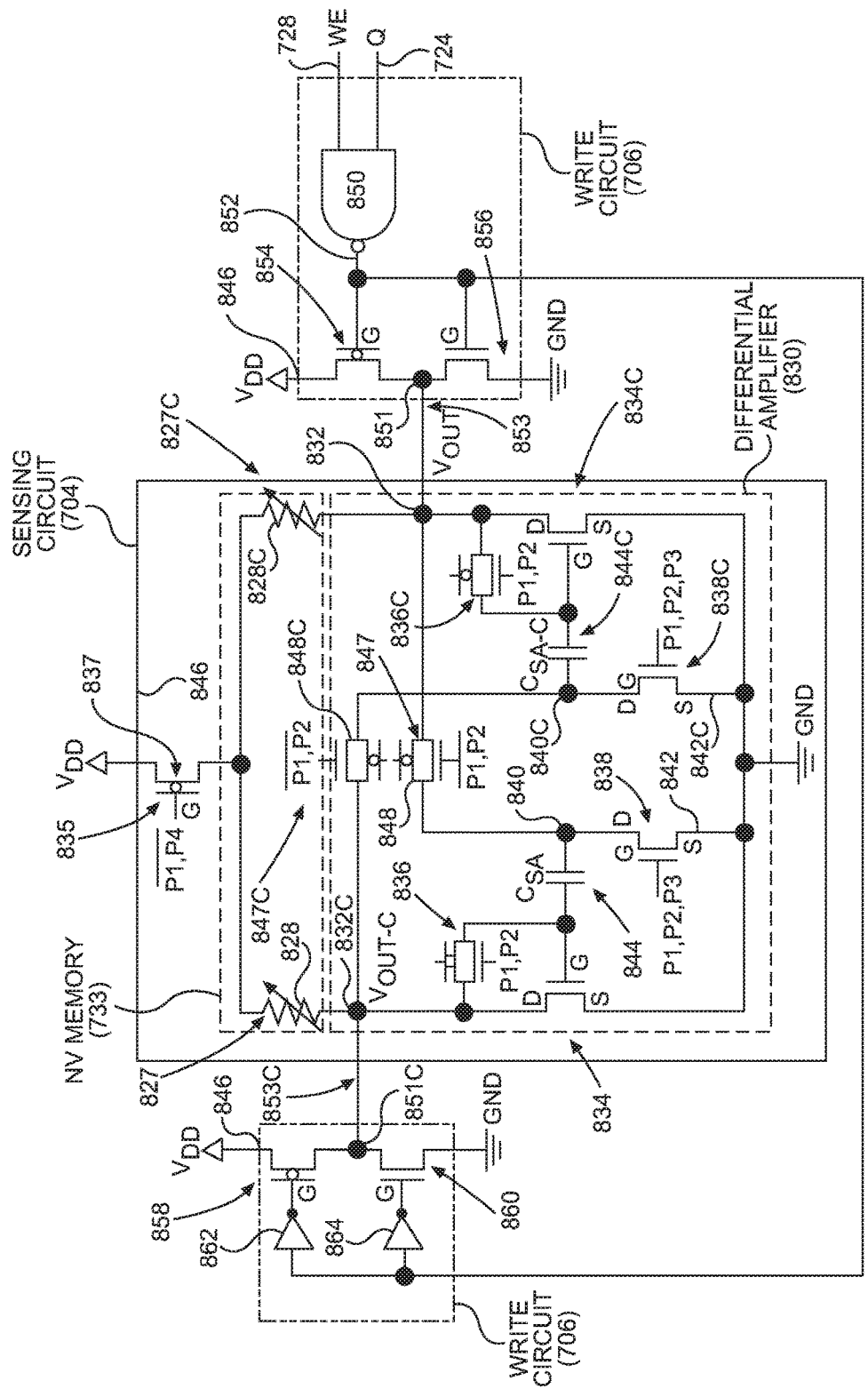
FIG. 8B is a circuit diagram of the sensing circuit and a write circuit in the OCSC-based NV memory circuit in FIG. 8A.

FIG. 8B is a circuit diagram of the sensing circuit 704 and write circuit 706 in the OCSC-based NV memory circuit 700 in FIG. 8A. The details of the sensing circuit 704 and write circuit 706 will be described in FIG. 8B followed by a discussion of exemplary operation of the sensing circuit 704 and write circuit 706 in FIGS. 9A-1-11 below.

With reference to FIG. 8B, the sensing circuit 704 includes NV memory circuits 827, 827C in the form of magnetic tunnel junctions (MTJ) 828, and complement MTJ 828C. The MTJ 828 and complement MTJ 828C are NV devices that can retain a memory state without power as a function of the magnetic orientation of a free layer therein with regard to the magnetic orientation of a pinned layer therein. The magnetic orientations of the MTJ 828 and complement MTJ 828C affect their resistance. For example, the free layer and pinned layer being in a parallel (P) magnetic orientation may represent a logical '1' memory state and result in a lower resistance than the free layer and pinned layer being in an anti-parallel (AP) magnetic orientation, which represents a logical '0' memory state, resulting in a higher resistance. The MTJ 828 and complement MTJ 828C are configured to store opposite memory states so that the memory states of the MTJ 828 and complement MTJ 828C can be sensed by a differential amplifier for increased accuracy and sensitivity to improve restoration performance. In this regard, the sensing circuit 704 includes a differential amplifier 830. The differential amplifier 830 includes an output node 832 configured to receive an output voltage $V_{OUT}$ representing the stored memory state in the MTJ 828. The differential amplifier 830 also includes a complement output node 832C configured to receive a complement output voltage $V_{OUT-C}$ representing the stored memory state in the complement MTJ 828C. The differential amplifier 830 includes a differential transistor 834 with a gate G, a first node D (e.g., a drain), and a second node S (i.e., a source) coupled to a ground node GND. The first node D and the second node S could be a drain node and a source node respectively, or vice versa. In this example, the differential amplifier 830 is an NMOS transistor wherein the first node D is a drain node and the second node S is a source node.

Similarly, the differential amplifier 830 also includes a complement differential transistor 834C cross-coupled to the complement differential transistor 834C, and which includes a gate G, a third node D (e.g., a drain), and a fourth node S (i.e., a source) coupled to the ground node GND. The third node D and the fourth node S could be a drain node and a source node respectively, or vice versa.

With continuing reference to FIG. 8B, the differential amplifier 830 also includes a pre-charge control circuit 836, which is a pass gate in this example formed from two (2) NMOS transistors. The pre-charge control circuit 836 is coupled between the gate G of the differential transistor 834 and the complement output node 832C. The complement pre-charge control circuit 836C is configured to be activated to couple the gate G of the differential transistor 834 and the complement output node 832C. As shown in FIG. 8B, the gate G of the pre-charge control circuit 836 is coupled to a first pre-charge input signal P1 and an offset-cancelling input signal P2, which will be discussed in more detail below. The differential amplifier 830 also includes a complement pre-charge control circuit 836C, which is a pass gate in this example formed from two (2) NMOS transistors. The complement pre-charge control circuit 836C is coupled between the gate G of the complement differential transistor 834C and the output node 832. The complement pre-charge control circuit 836C is configured to be activated to couple the gate G of the complement differential transistor 834C and the output node 832. As shown in FIG. 8B, the gate G of the complement pre-charge control circuit 836C is coupled to the first pre-charge input signal P1 and the offset-cancelling input signal P2.

With continuing reference to FIG. 8B, the differential amplifier 830 also includes a differential amplifier control circuit 835 in the form of a PMOS transistor 837 coupled between a supply node 846 and an MTJ 828 and complement NV memory circuit 827C. The PMOS transistor 837 includes a gate G coupled to the first pre-charge input signal P1 and the comparison signal P4. The PMOS transistor 837 is configured to be activated when the first pre-charge input signal P1 and the comparison signal P4 are active (e.g., logical '1'). The differential amplifier 830 also includes a ground control circuit 838 in the form of an NMOS transistor 842 in this example coupled between the ground node GND and a capacitor node 840. The NMOS transistor 842 includes a gate G coupled to the first pre-charge input signal P1, the offset-cancelling input signal P2, and a second pre-charge input signal P3. The NMOS transistor 842 includes a first node D coupled to the capacitor node 840 and a second node S coupled to the ground node GND. The differential amplifier 830 also includes a complement ground control circuit 838C in the form of an NMOS transistor 842C in this example coupled between the ground node GND and a complement capacitor node 840C. The NMOS transistor 842C includes a gate G coupled to the first pre-charge input signal P1, the offset-cancelling input signal P2, and the second pre-charge input signal P3. The NMOS transistor 842C also includes a first node D coupled to the complement capacitor node 840C and a second node S coupled to the ground node GND. The differential amplifier 830 also includes a capacitor circuit 844 in the form of a capacitor $C_{SA}$ in this example coupled between the gate G of the differential transistor 834 and the capacitor node 840. The differential amplifier 830 also includes a complement capacitor circuit 844C in the form of a capacitor $C_{SA-C}$ (also referred to herein as "complement capacitor $C_{SA-C}$") in this example coupled between the gate G of the complement differential transistor 834C and the complement capacitor node 840C.

With continuing reference to FIG. 8B, the NV memory circuit 827 in the form of the MTJ 828 is coupled between the complement output node 832C and a supply node 846 configured to be coupled to the supply voltage $V_{DD}$. The complement NV memory circuit 827C in the form of the complement MTJ 828C is coupled between the output node 832 and the supply node 846. The differential amplifier 830 also includes a second pre-charge control circuit 847 coupled between the capacitor node 840 and the output node 832. The second pre-charge control circuit 847 is provided in the form of a pass gate 848 that includes two (2) NMOS transistors. The pass gate 848 is configured to be activated in response to the complement of the pre-charge input signal P1 and the complement of the offset-cancelling input signal P2. The differential amplifier 830 also includes a second complement pre-charge control circuit 847C coupled between the complement capacitor node 840C and the complement output node 832C. The second complement pre-charge control circuit 847C is also provided in the form of a pass gate 848C that includes two (2) NMOS transistors. The pass gate 848C is configured to be activated in response to the complement of the pre-charge input signal P1 and the complement of the offset-cancelling input signal P2.

With continuing reference to FIG. 8B, the write circuit 706 is also shown. The write circuit 706 includes a write driver circuit 850 in the form of a NAND gate that is coupled to the write enable line 728 and the latch output 724. An output 852 of the write driver circuit 850 is coupled to a gate G of a pull-up PMOS transistor 854 coupled to the supply node 846 and a pull-down NMOS transistor 856 coupled to the ground node GND. When the write enable signal WE on the write enable line 728 is in a write enable state (i.e., a logical '1') and the output data signal Q is a logical '0' value, the output 852 of the write driver circuit 850 causes the pull-down NMOS transistor 856 coupled to the output node 832 to the ground node GND to write a logical '0' as a write output signal 853 to a write output node 851 to the output node 832. As discussed above, the write circuit 706 is configured to write the logical value of the output data signal Q to the NV memory circuits 827, 827C in the sensing circuit 704 to be retained in an idle mode and restored to the slave latch 712 (FIG. 8A) in an active mode after coming out of the idle mode. When the write enable signal WE on the write enable line 728 is in a write enable state (i.e., a logical '1') and the output data signal Q is a logical '1' value, the output 852 of the write driver circuit 850 causes the pull-up PMOS transistor 854 to couple the output node 832 to the supply node 846 to write a logical '1' to the output node 832. Similarly, the write circuit 706 includes another pull-up PMOS transistor 858 coupled to the supply node 846 and a pull-down NMOS transistor 860 coupled to the ground node GND. A gate G of the pull-up PMOS transistor 858 and the pull-down NMOS transistor 860 are coupled to outputs of inverter gates 862, 864 that receive and invert the output 852 of the write driver circuit 850 as a complement write output signal 853C on a complement write output node 851C coupled to the complement output node 832C. Thus, whatever data is written by the write driver circuit 850 in the write circuit 706 to the output node 832, the opposite data (i.e., opposite logical value) is written to the complement output node 832C.

Now that the exemplary details of the OCSC-based NV memory circuit 700 have been described, the operational aspects of the exemplary OCSC-based NV memory circuit 700 to sense and restore a sensed memory state in the NV memory circuits 827, 827C will now be described with regard to FIGS. 9A-1-10.

Figure 2:
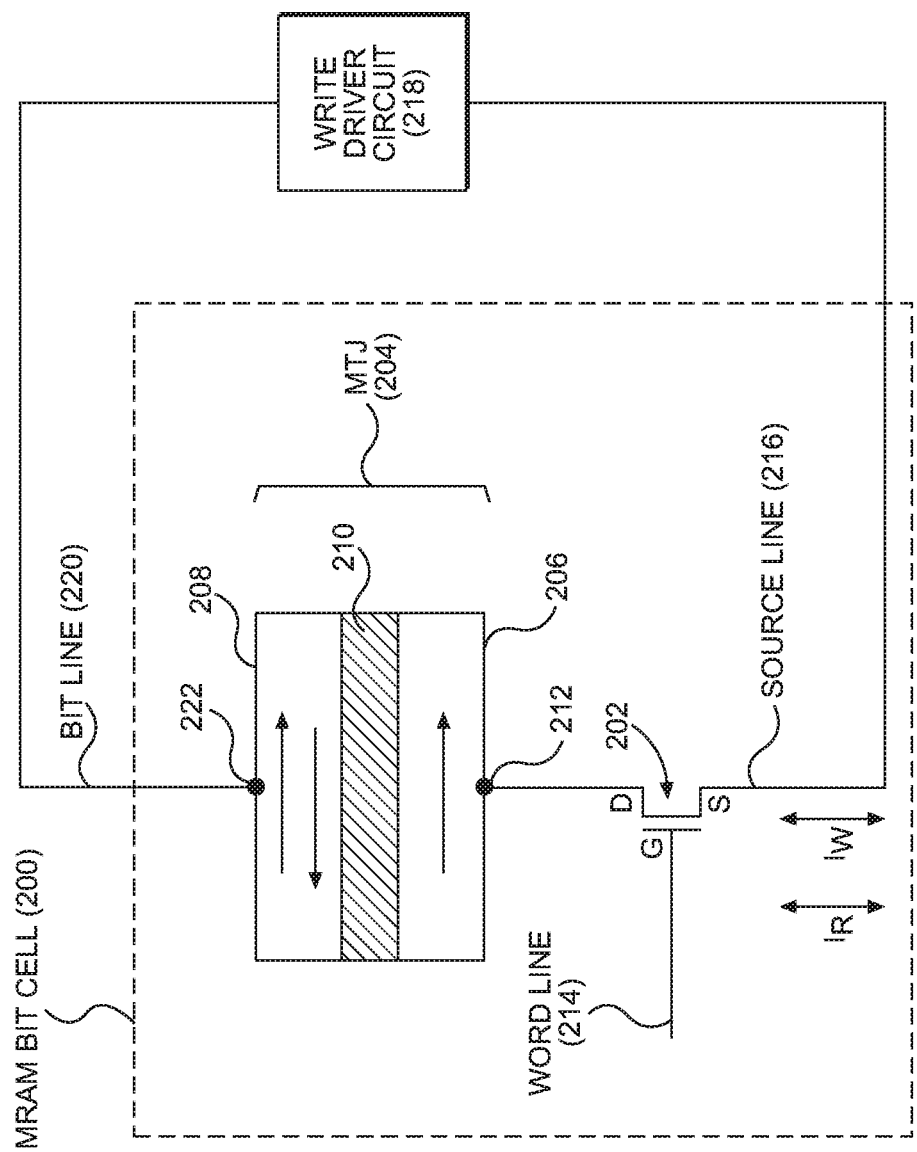
FIG. 2 is a diagram of an exemplary magneto-resistive random access memory (MRAM) bit cell employing a magnetic tunnel junction (MTJ)
Figures 1, 9B:
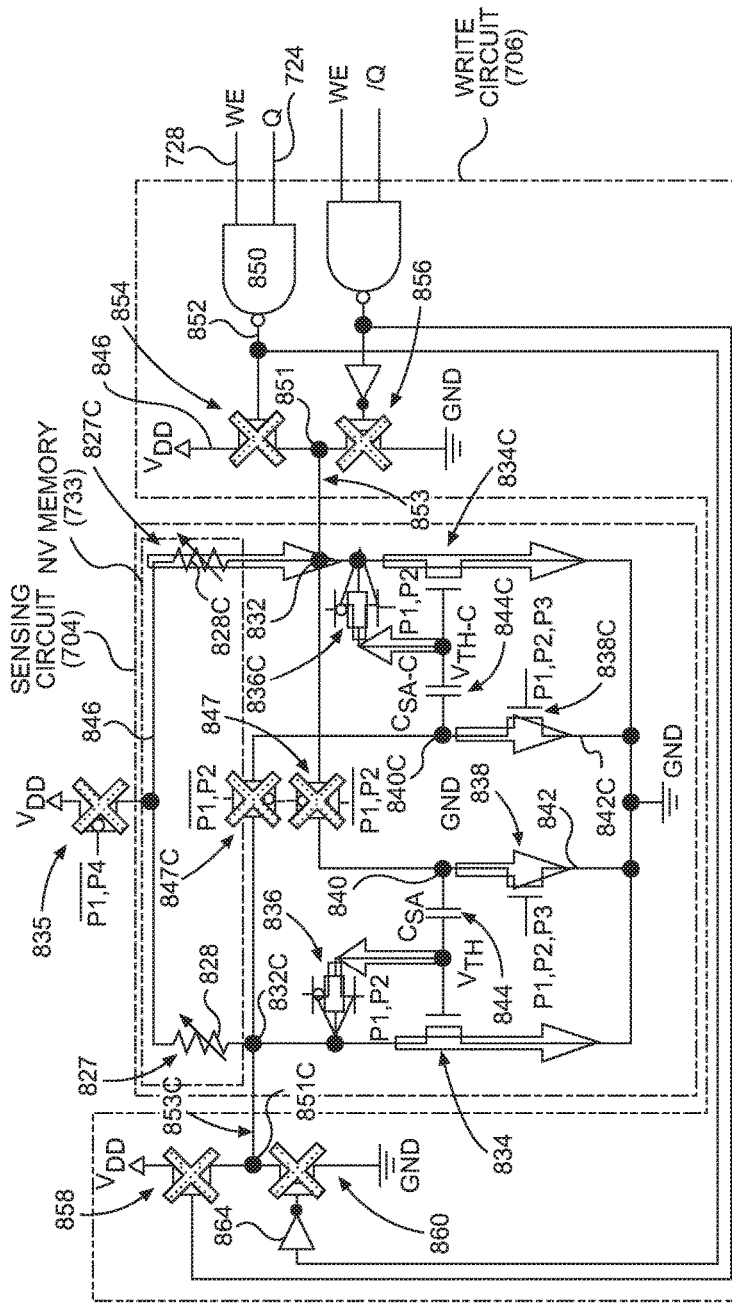
Figures 2, 9B:
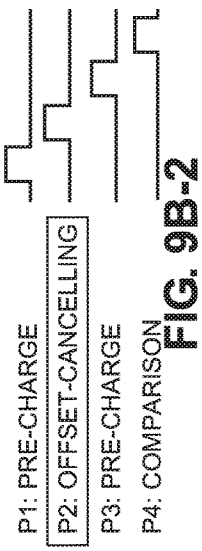

In this regard, FIG. 9A-1 illustrates a first pre-charge operational phase of the sensing circuit 704 and write circuit 706 in the OCSC-based NV memory circuit 700 in FIG. 8A. The first pre-charge operational phase is to pre-charge the gates G of the differential transistor 834 and complement differential transistor 834C in the differential amplifier 830 to a pre-charge voltage and complement pre-charge voltage $V_{PRE}$, $V_{PRE-C}$ to then allow the voltage at these gates G to discharge to the respective threshold voltages of their differential transistor 834 and complement differential transistor 834C for offset-cancellation in a follow on operational step. In this regard, as shown in timing diagram 900 in FIG. 9A-2, a first pre-charge input signal P1 is pulsed to initiate a pre-charge operational phase. As discussed above, the first pre-charge input signal P1 is coupled to the gate G of the differential amplifier control circuit 835, the pre-charge and complement pre-charge control circuits 836, 836C, and the ground and complement ground control circuits 838, 838C, all of which are activated in response to the first pre-charge input signal P1 indicating the first pre-charge operational phase. Thus, in response to the first pre-charge input signal P1 indicating a first pre-charge operational phase, the differential amplifier control circuit 835 is configured to couple the supply voltage Vdd to the NV memory circuit 827 and the complement NV memory circuit 827C. Also in response to the first pre-charge input signal P1 indicating a first pre-charge operational phase, the pre-charge control circuit 836 and complement pre-charge control circuit 836C are configured to couple the NV memory circuit 827 and complement NV memory circuit 827C, respectively, to the gates G of the differential transistor 834 and the complement differential transistor 834C, respectively. Also in response to the first pre-charge input signal P1 indicating a first pre-charge operational phase, the ground control circuit 838 and complement ground control circuit 838C are configured to couple the capacitor node 840 and complement capacitor node 840C, respectively, to the ground node GND. These circuit activations cause the gates G of the differential transistor 834 and the complement differential transistor 834C to be pre-charged to a pre-charge voltage and complement pre-charge voltage $V_{PRE}$, $V_{PRE-C}$ respectively based on the supply voltage $V_{DD}$. The pre-charge voltage and complement pre-charge voltage $V_{PRE}$, $V_{PRE-C}$ applied to the gates G of the differential transistor 834 and the complement differential transistor 834C charge the capacitor $C_{SA}$ and the complement capacitor $C_{SA-C}$ so that the energy from the capacitor $C_{SA}$ and the complement capacitor $C_{SA-C}$ can be discharged on the gates G of the differential transistor 834 and the complement differential transistor 834C. The threshold voltages may be different between the differential transistor 834 and the complement differential transistor 834C based on their process variations. This allows differences in these threshold voltages to be offset to cancel the offset of the differential amplifier 830 to increase sensing margin and sensing accuracy. The write circuit 706 is disabled during the first pre-charge operational phase by the write enable signal WE being in a write disable state.

In this regard, FIG. 9B-1 illustrates an offset-cancellation operational phase of the sensing circuit 704 and write circuit 706 in the OCSC-based NV memory circuit 700 in FIG. 8A. The offset-cancellation operational phase is to cancel the offset of the differential transistor 834 and the complement differential transistor 834C in the differential amplifier 830 before sensing the memory states in the NV memory circuits 827, 827C. In this regard, as shown in timing diagram 902 in FIG. 9B-2, an offset-cancellation input signal P2 is pulsed to initiate the offset-cancellation operational phase. As discussed above, an offset-cancellation input coupled to the pre-charge and complement pre-charge control circuits 836, 836C, and the ground and complement ground control circuits 838, 838C, is configured to receive and be activated in response to the offset-cancellation input signal P2 indicating the offset-cancellation operational phase. In this example, the offset-cancellation input is the gates G of the NMOS transistors of pre-charge and complement pre-charge control circuits 836, 836C, and gates G of the NMOS transistors of the ground and complement ground control circuits 838, 838C. The differential amplifier control circuit 835 is not activated in response to the offset-cancellation input signal P2 indicating the offset-cancellation operational phase, thus decoupling the supply voltage $V_{DD}$ from the differential amplifier 830 during the offset-cancellation operational phase. Thus, in response to the offset-cancellation input signal P2 indicating an offset-cancellation operational phase, the pre-charge control circuit 836 and complement pre-charge control circuit 836C are configured to couple the NV memory circuit 827 and complement NV memory circuit 827C, respectively, to the gates G of the differential transistor 834 and the complement differential transistor 834C, respectively. Also in response to the offset-cancellation input signal P2 indicating the offset-cancellation operational phase, the ground control circuit 838 and complement ground control circuit 838C are configured to couple the capacitor node 840 and complement capacitor node 840C, respectively, to the ground node GND. These circuit activations cause the gates G of the differential transistor 834 and the complement differential transistor 834C to be pre-charged to a respective pre-charge voltage and complement pre-charge voltage $V_{PRE}$, $V_{PRE-C}$ based on the supply voltage $V_{DD}$. The capacitor $C_{SA}$ and the complement capacitor $C_{SA-C}$ are discharged to the gates G of the differential transistor 834 and the complement differential transistor 834C to activate the differential transistor 834 and the complement differential transistor 834C and allow current to flow through the pre-charge control circuit 836 and complement pre-charge control circuit 836C and the differential transistor 834 and the complement differential transistor 834C to the ground node GND until the gates G of the differential transistor 834 and the complement differential transistor 834C reach their respective threshold voltages. This is because once the voltage at the gates G falls to the threshold voltage of their respective differential transistor 834 and the complement differential transistor 834C, the differential transistor 834 and the complement differential transistor 834C turn off. The gates G of the differential transistor 834 and the complement differential transistor 834C are discharged to threshold voltages $V_{TH1}$, $V_{TH2}$, which cancels the offset between the differential transistor 834 and the complement differential transistor 834C. The write circuit 706 is disabled during the offset-cancellation operational phase by the write enable signal WE being in a write disable state.

Figures 1, 2, 9C:
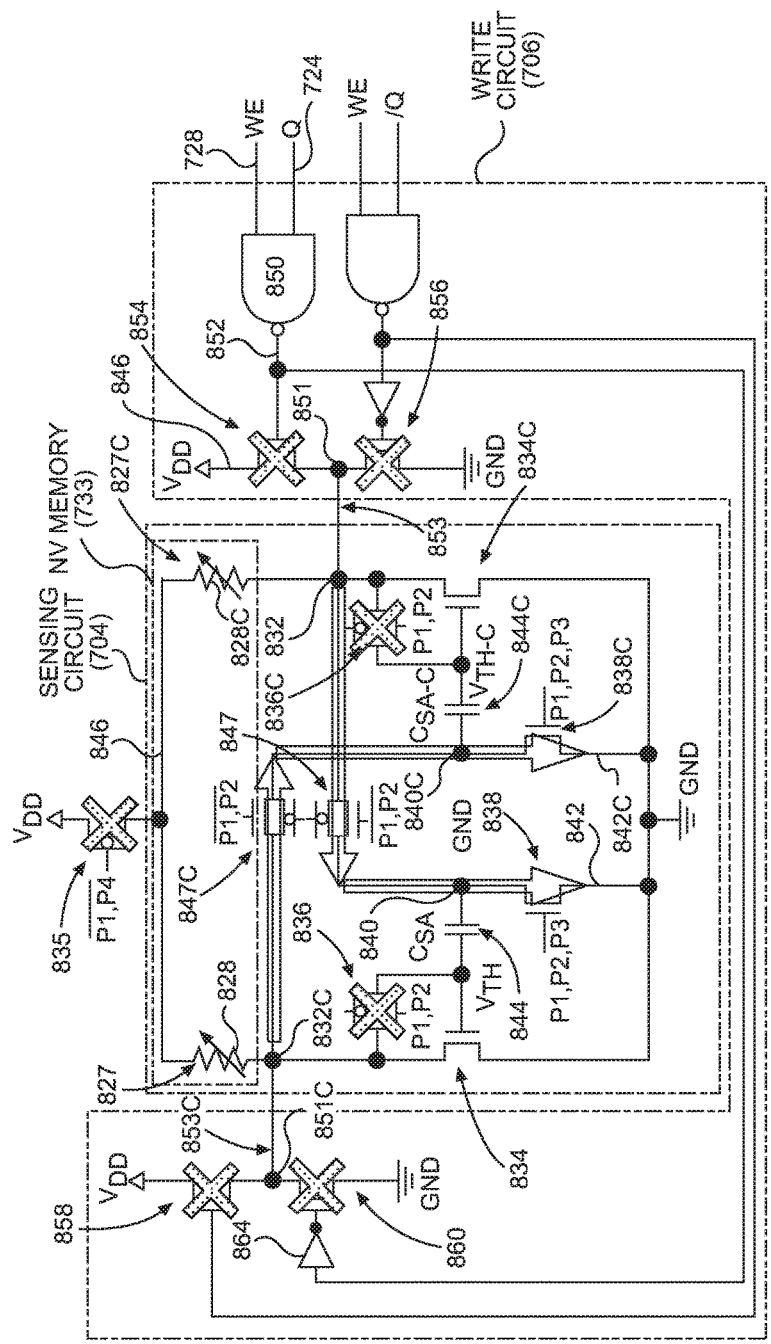

FIG. 9C-1 illustrates a second pre-charge operational phase of the sensing circuit 704 and write circuit 706 in the OCSC-based NV memory circuit 700 in FIG. 8A. The second pre-charge operational phase involves discharging both the output node 832 and complement output node 832C to the voltage at the ground node GND to prepare to sense the difference in resistance between the NV memory circuits 827, 827C as a function of their output voltages applied to the output node 832 and complement output node 832C by the differential amplifier 830. In this regard, as shown in timing diagram 904 in FIG. 9C-2, a second pre-charge input signal P3 is pulsed to initiate the second pre-charge operational phase. As discussed above, the second pre-charge control circuit 847 is coupled to the ground control circuit 838. The pre-charge control circuit 836 and complement pre-charge control circuit 836C are also activated during the second pre-charge operational phase. The differential amplifier control circuit 835 is not activated in response to the second pre-charge input signal P3 indicating the second pre-charge operational phase, thus decoupling the supply voltage $V_{DD}$ from the differential amplifier 830 during the second pre-charge operational phase. Thus, in response to the second pre-charge input signal P3 indicating the second pre-charge operational phase, the pre-charge control circuit 836 and complement pre-charge control circuit 836C are configured to couple the output node 832 and complement output node 832C to the ground and complement ground control circuits 838, 838C. Also in response to the second pre-charge input signal P3 indicating the second pre-charge operational phase, the ground control circuit 838 and complement ground control circuit 838C are configured to couple the capacitor node 840 and complement capacitor node 840C, respectively, to the ground node GND. These circuit activations cause the output node 832 and complement output node 832C to be discharged to the voltage at the ground node GND. The write circuit 706 is disabled during the second pre-charge operational phase by the write enable signal WE being in a write disable state.

Figures 1, 2, 9D:
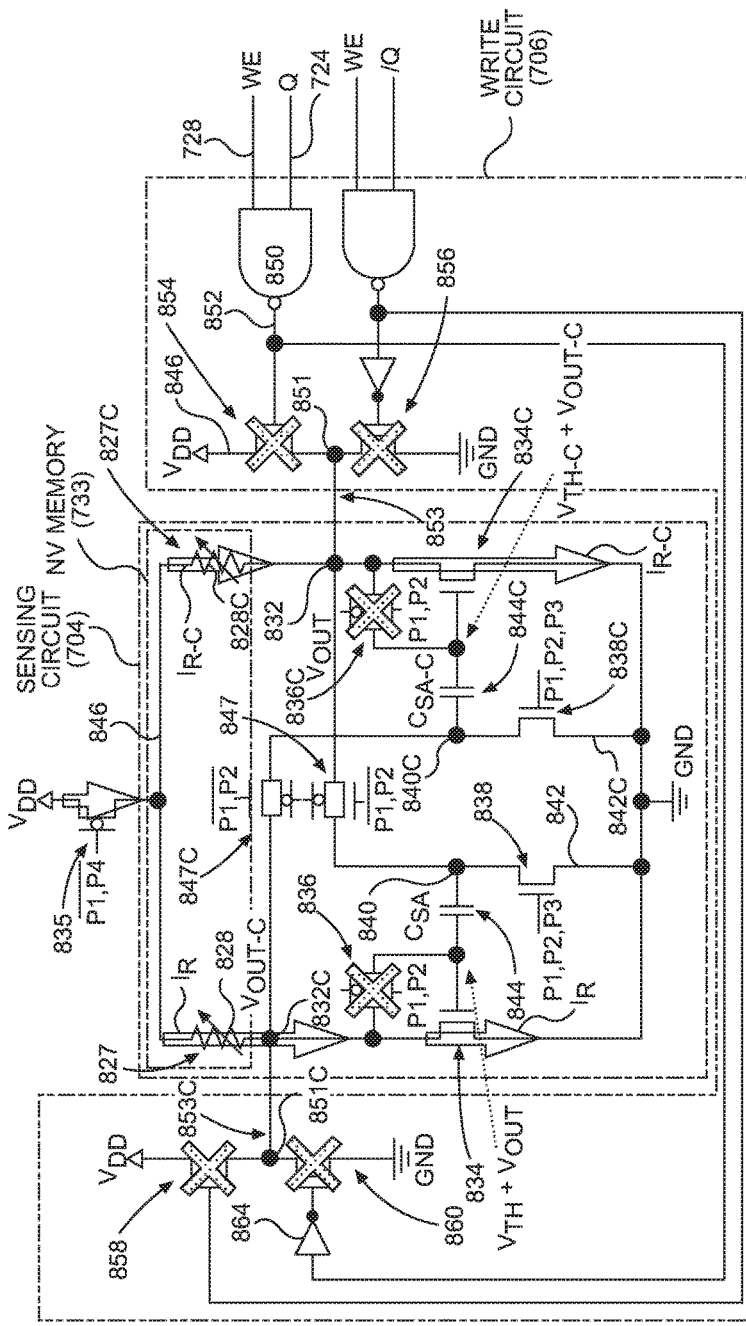

FIG. 9D-1 illustrates a comparison operational phase of the sensing circuit 704 and write circuit 706 in the OCSC-based NV memory circuit 700 in FIG. 8A. The comparison operational phase involves the differential amplifier 830 comparing the difference in resistances in the NV memory circuits 827, 827C as a function of the voltages $V_{OUT}$, $V_{OUT-C}$ on the respective output node 832 and complement output node 832C. As discussed above previously with regard to FIG. 7A, the sensing circuit 704 is configured to communicate a data signal 738 representing the output voltage $V_{OUT}$ to the slave latch 712 to restore the latched data in the slave latch 712 upon restoration into active mode from an idle mode. In this regard, as shown in timing diagram 906 in FIG. 9D-2, a comparison input signal P4 is pulsed to initiate the comparison operational phase. As discussed above, the comparison input signal P4 is coupled to the differential amplifier control circuit 835. In this example, the gate of the NMOS transistor of the differential amplifier control circuit 835 is a comparison input configured to receive the comparison input signal P4. In response to the comparison input signal P4 indicating the comparison operational phase, the differential amplifier control circuit 835 is configured to couple the supply voltage $V_{DD}$ to the NV memory circuits 827, 827C such that a read current $I_R$, $I_{R-C}$ flows through the NV memory circuit and complement NV memory circuit 827, 827C and the differential transistor 834 and complement differential transistor 834C to the ground node GND. The pre-charge control circuit 836 and complement pre-charge control circuit 836C are configured to decouple the gates G of the differential transistor 834 and complement differential transistor 834C from the NV memory circuit 827 and complement NV memory circuit 827C. This causes the voltage drop across the differential transistor 834 to be its threshold voltage $V_{TH1}$ at the gate G of the differential transistor 834 plus the output voltage $V_{OUT}$ at the output node 832. This also causes the voltage drop across the complement differential transistor 834C to be its threshold voltage $V_{TH2}$ at the gate G of the complement differential transistor 834C plus the complement output voltage $V_{OUT-C}$ at the complement output node 832C. Output voltage $V_{OUT}$ and the complement output voltage $V_{OUT-C}$ become almost rail to rail voltages between the supply node 846 and the ground node GND due to the positive feedback of the cross-coupled differential transistor 834 and complement differential transistor 834C. However, if the resistance of the NV memory circuit 827 is less than the resistance of the complement NV memory circuit 827C, the complement output node 832C is charged faster to complement output voltage $V_{OUT-C}$ than the output node 832 charged to output voltage $V_{OUT}$. This leads to the complement output voltage $V_{OUT-C}$ on the complement output node 832C being forced to a voltage greater than $V_{OUT}$ due to the positive feedback of the differential transistor 834 cross-coupled to the complement differential transistor 834C. Thus, the output voltage $V_{OUT}$ on the output node 832 represents the difference in resistance between the NV memory circuit 827 and the complement NV memory circuit 827C. Note that the overdrive voltage of differential transistor 834 and the complement differential transistor 834C does not depend on its threshold voltage $V_{TH}$, $V_{TH-C}$ variation. Thus, offset-cancelling is achieved The capacitance value of capacitor $C_{SA}$ determines how well the capacitor $C_{SA}$ holds the threshold voltage $V_{TH}$ of the differential transistor 834. Likewise, the capacitance value of complement capacitor $C_{SA-C}$ determines how well the complement capacitor $C_{SA-C}$ holds the threshold voltage $V_{TH-C}$ of the complement differential transistor 834C. Thus, larger capacitors $C_{SA}$, $C_{SA-C}$ obtain a higher restore yield. Additionally, the capacitance mismatch of other differential transistors 834 and complement differential transistors 834C is gradually ignored in proportion to an increase in the capacitance of capacitors $C_{SA}$, $C_{SA-C}$ respectively. As an example, to obtain a target restore yield of 4σ, the capacitor $C_{SA}$ may need to be larger than 3 fF corresponding to the MOSCAP size of 1.8 μm/0.2 μm (W/L).

Figure 10:
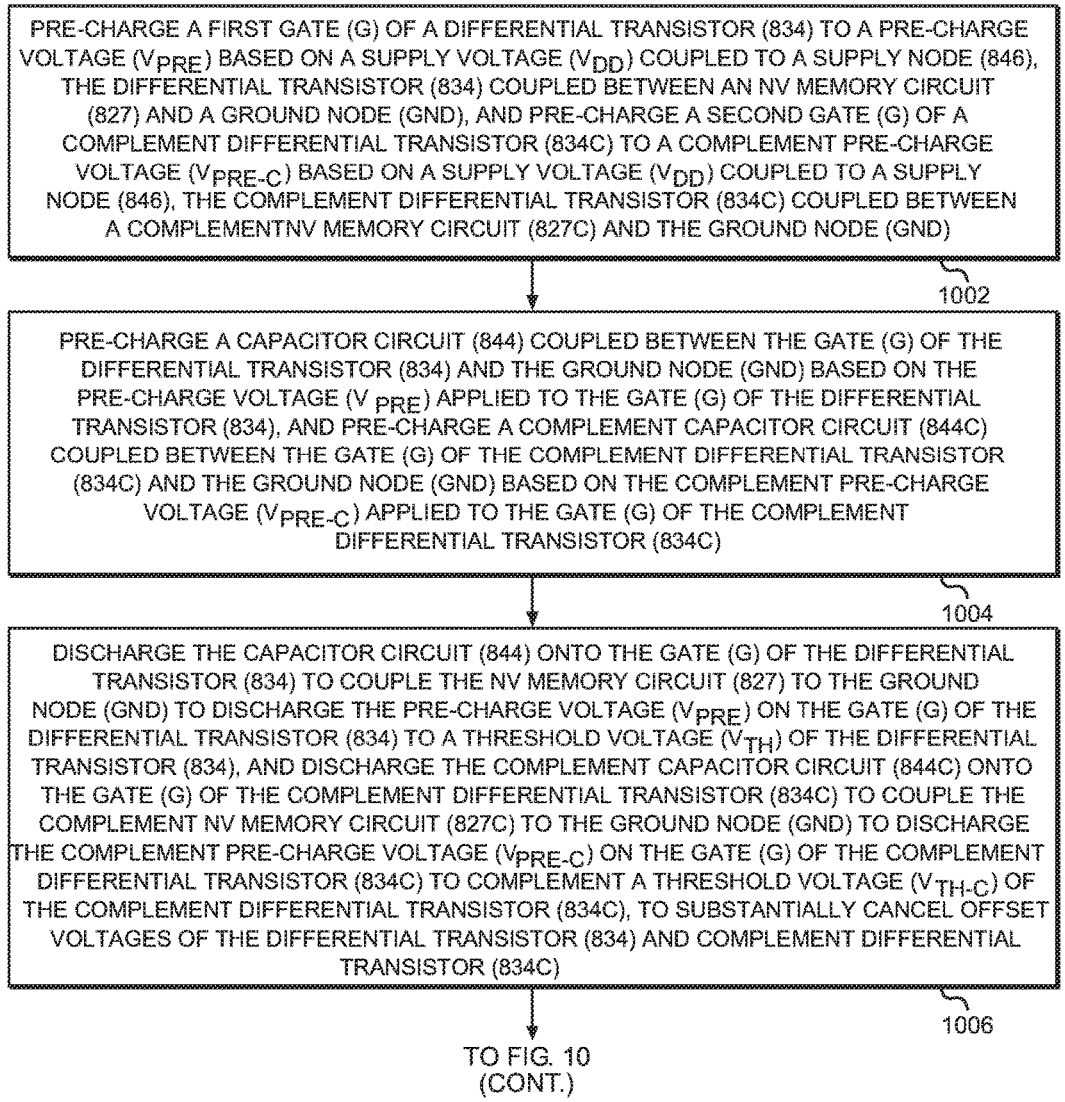
FIG. 10 is a flowchart illustrating an exemplary process of the sensing circuit in the OCSC-based NV memory circuit in FIG. 8A for generating an output representing a sensed memory state stored in NV memory circuits for restoring a memory state in a latch circuit.
Figure 10:
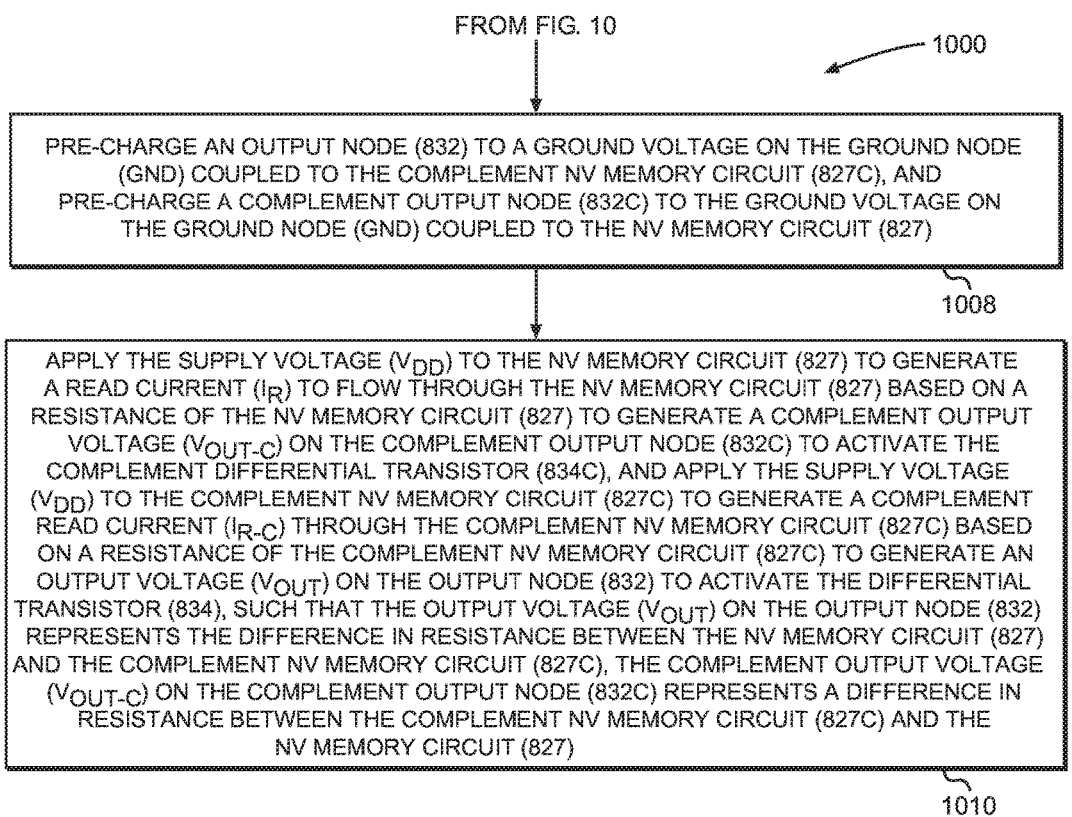

FIG. 10 is a flowchart illustrating an exemplary process 1000 of the sensing circuit 704 in the OCSC-based NV memory circuit 700 in FIG. 8A for generating the output voltage $V_{OUT}$ representing a sensed memory state stored in the NV memory circuit and complement NV memory circuit 827, 827C for restoring the memory state in the D flip-flop 708. In this regard, the process 1000 involves pre-charging a gate G of a differential transistor 834 to a pre-charge voltage $V_{PRE}$ based on a supply voltage $V_{DD}$ coupled to a supply node 846, wherein the differential transistor 834 is coupled between an NV memory circuit 827 and a ground node GND, and pre-charging a gate G of a complement differential transistor 834C to a complement pre-charge voltage $V_{PRE-C}$ based on a supply voltage $V_{DD}$ coupled to a supply node 846, wherein the complement differential transistor 834C is coupled between a complement NV memory circuit 827C and the ground node GND (block 1002). A next step involves pre-charging a capacitor circuit 844 coupled between the gate G of the differential transistor 834 and the ground node GND based on the pre-charge voltage $V_{PRE}$ applied to the gate G of the differential transistor 834, and pre-charging a complement capacitor circuit 844C coupled between the gate G of the complement differential transistor 834C and the ground node GND based on the complement pre-charge voltage $V_{PRE-C}$ applied to the gate G of the complement differential transistor 834C (block 1004). These process steps 1002, 1004 were shown by example in FIG. 9A-1 described above.

With continuing reference to FIG. 10, a next step involves discharging the capacitor circuit 844 onto the gate G of the complement differential transistor 834C to couple the NV memory circuit 827 to the ground node GND to discharge the pre-charge voltage $V_{PRE}$ on the gate G of the differential transistor 834 to a threshold voltage $V_{TH}$ of the differential transistor 834, and discharging the complement capacitor circuit 844C onto the gate G of the complement differential transistor 834C to couple the complement NV memory circuit 827C to the ground node GND to discharge the complement pre-charge voltage $V_{PRE-C}$ on the gate G of the complement differential transistor 834C to complement threshold voltage $V_{TH-C}$ of the complement differential transistor 834C, to substantially cancel the offset voltages of the differential transistor 834 and complement differential transistor 834C (block 1006). This process step 1006 was shown by example in FIG. 9B-1 described above.

A next step involves pre-charging an output node 832 to a ground voltage on the ground node GND coupled to the complement NV memory circuit 827C, and pre-charging a complement output node 832C to the ground voltage on the ground node GND coupled to the NV memory circuit 827 (block 1008). This process step 1008 was shown by example in FIG. 9C-1 described above.

With continuing reference to FIG. 10, a next step involves applying the supply voltage $V_{DD}$ to the NV memory circuit 827 to generate a read current $I_R$ to flow through the NV memory circuit 827 based on a resistance of the NV memory circuit 827 to generate a complement output voltage $V_{OUT-C}$ on the complement output node 832C to activate the complement differential transistor 834C, and applying the supply voltage $V_{DD}$ to the complement NV memory circuit 827C to generate a complement read current $I_{R-C}$ through the complement NV memory circuit 827C based on a resistance of the complement NV memory circuit 827C to generate an output voltage $V_{out}$ on the output node 832 to activate the differential transistor 834, such that the output voltage $V_{out}$ on the output node 832 represents the difference in resistance between the NV memory circuit 827 and the complement NV memory circuit 827C, and the complement output voltage $V_{OUT-C}$ on the complement output node 832C represents the difference in resistance between the complement NV memory circuit 827C and the NV memory circuit 827 (block 1010). This process step 1010 was shown by example in FIG. 9D-1 described above.

Figure 11:
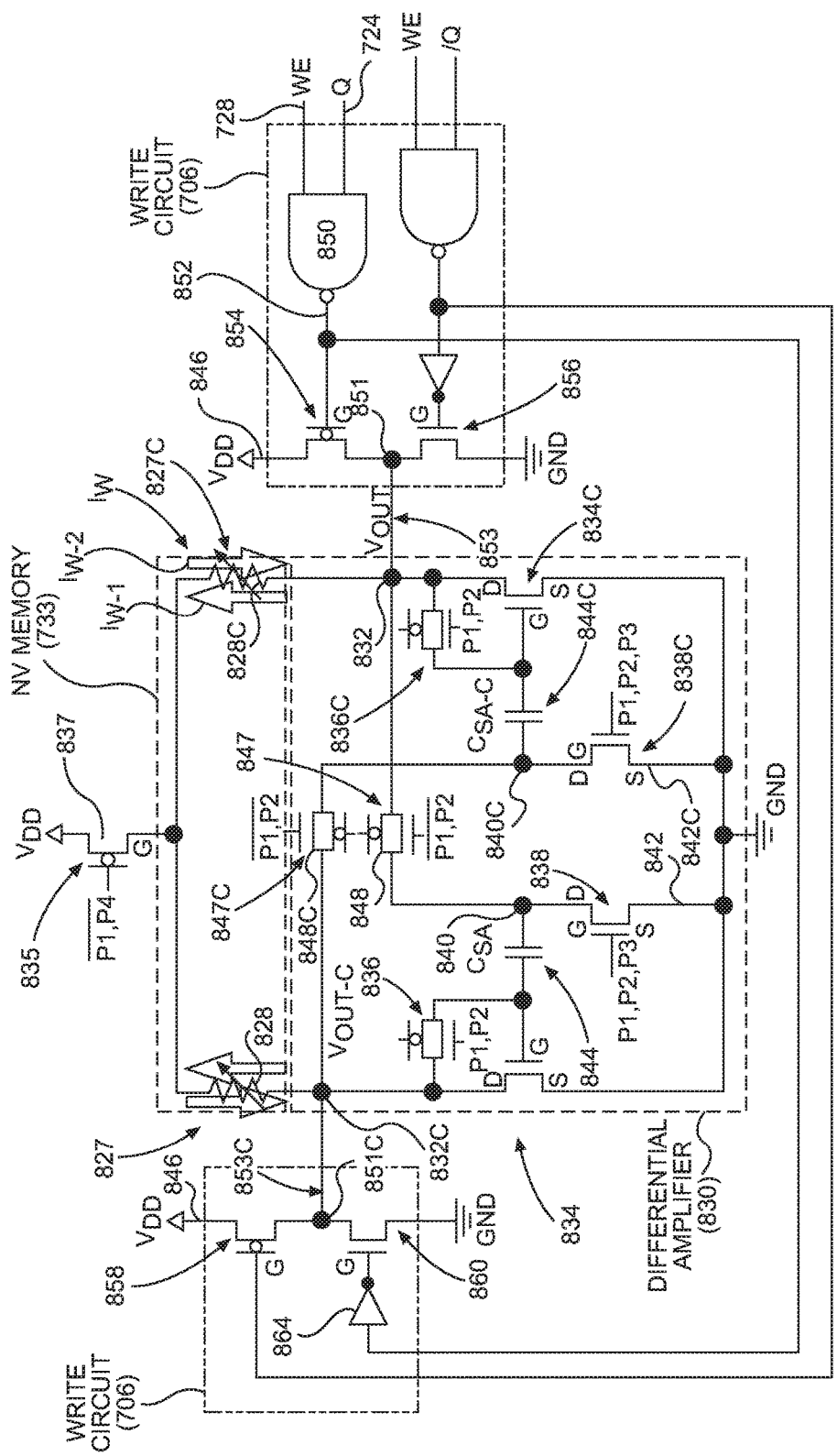
FIG. 11 illustrates a back-up operational phase of the sensing circuit and write circuit in the OCSC-based NV memory circuit in FIG. 8A to store a memory state of latched data in a latch circuit in the OCSC-based NV memory circuit.

FIG. 11 illustrates a back-up write operational phase of the sensing circuit 704 and write circuit 706 in the OCSC-based NV memory circuit 700 in FIG. 8A to store the memory state of the latched data in the D flip-flop 708 in the OCSC-based NV memory circuit 700. As shown in FIG. 11, when the write enable signal WE is asserted in a write enable state (e.g., logical '1' in this example), a write current $I_W$ starts to flow through the NV memory circuit 827 and complement NV memory circuit 827C. The direction of the write current $I_W$ is determined according to the output data signal Q. When the output data signal Q=1, a write current $I_{W-1}$ flows from right to left in FIG. 11. This programs the NV memory circuit 827 to a higher resistance and complement NV memory circuit 827C to a lower resistance. However, when the output data signal Q=0, a write current $I_{W-2}$ flows from left to right in FIG. 11. This programs the NV memory circuit 827 to a lower resistance and complement NV memory circuit 827C to have a higher resistance.

Figure 12:
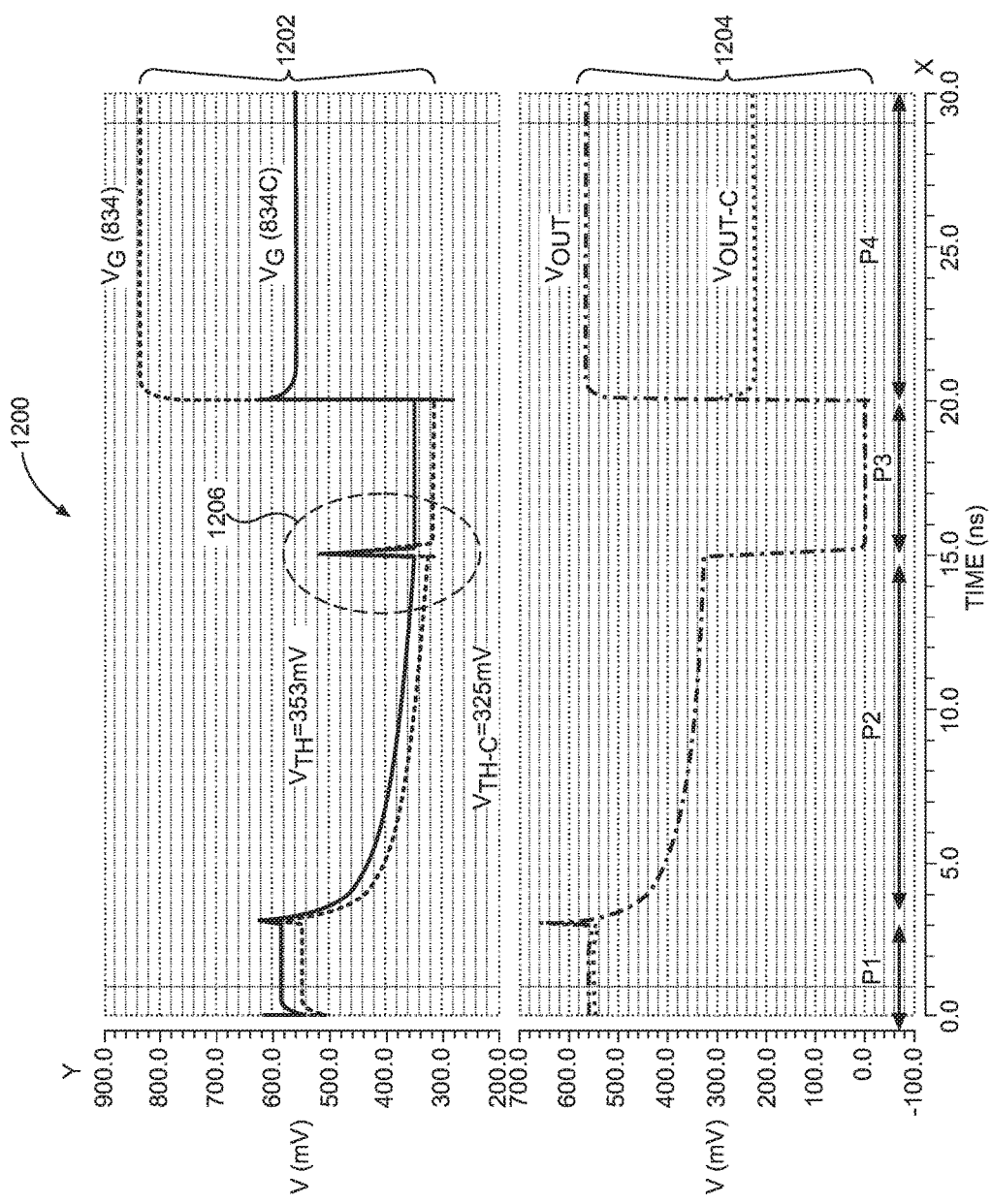
FIG. 12 is a diagram illustrating an exemplary transient response of the OCSC-based NV memory circuit in FIG. 8A.

FIG. 12 is a diagram of a chart 1200 illustrating an exemplary transient response of the OCSC-based NV memory circuit 700 in FIG. 8A. Operational phases P1-P4 are shown in the X-axis timing. The chart 1200 illustrates an example of the threshold voltage $V_{TH}$ of the differential transistor 834 being higher than the threshold voltage $V_{TH-C}$ of the complement differential transistor 834C. A top curve 1202 shows stored threshold voltages at the gates G (i.e., gate voltages $V_G$) f the differential transistor 834 and the complement differential transistor 834C for offset cancellation. A bottom curve 1204 shows output voltages $V_{OUT}$ and $V_{OUT-C}$ due to the effect of the offset voltage being cancelled as discussed above and according to the functionality of the OCSC-based NV memory circuit 700 in FIG. 8A.

OCSC-based NV memory circuits including but not limited to the OCSC-based NV memory circuit 700 in FIGS. 7A-11, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 13:
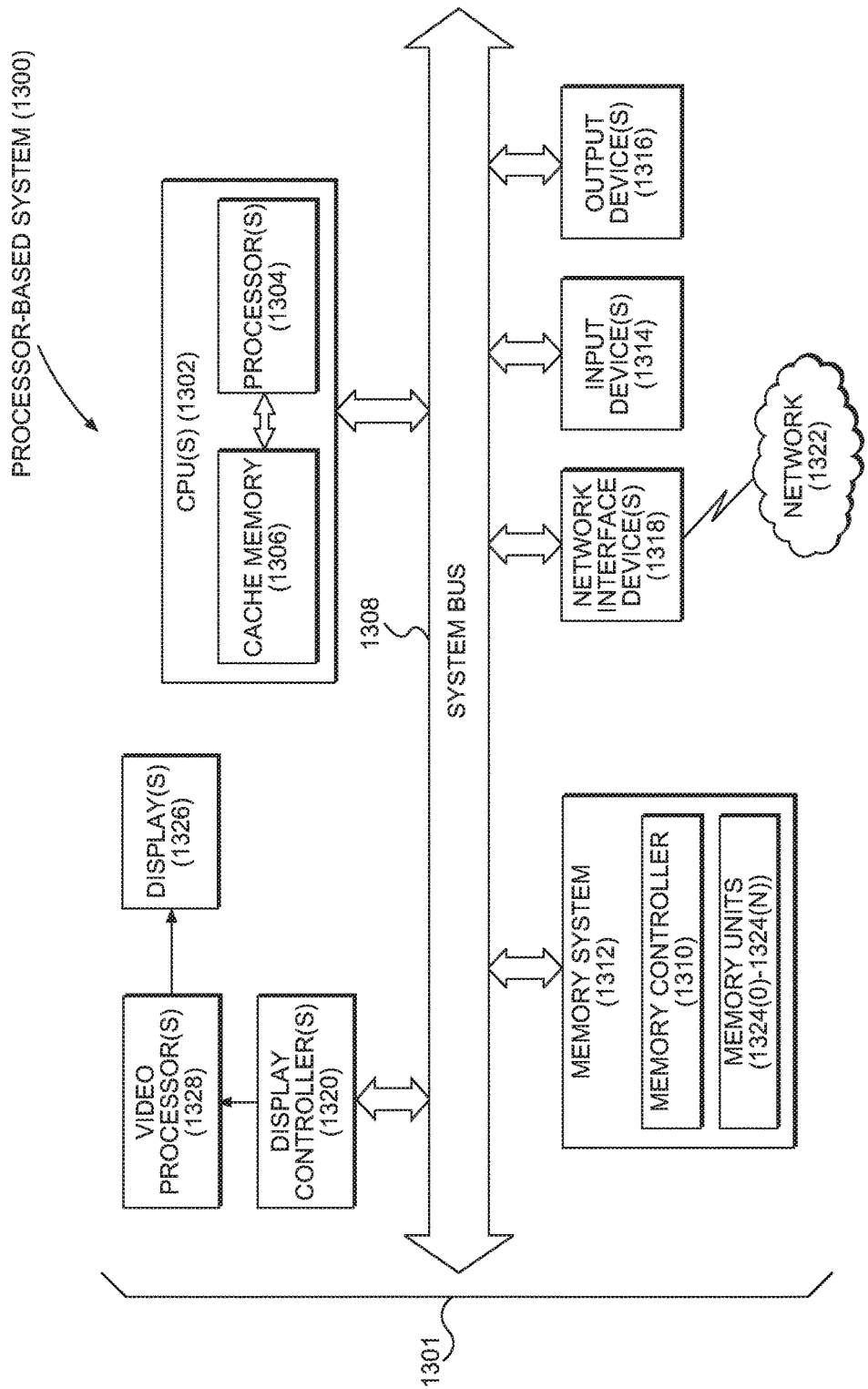
FIG. 13 is a block diagram of an exemplary processor-based system that can include OCSC-based NV memory circuits, including but not limited to the OCSC-based NV memory circuit in FIGS. 7A-11.

In this regard, FIG. 13 illustrates an example of a processor-based system 1300 that can include OCSC-based NV memory circuits 1301, including but not limited to the OCSC-based NV memory circuit 700 in FIGS. 7A-11. In this example, the processor-based system 1300 includes one or more central processing units (CPUs) 1302, each including one or more processors 1304. As an example, the processors 1304 could each include OCSC-based NV memory circuits 1301 including but not limited to the OCSC-based NV memory circuit 700 in FIGS. 7A-11. The CPU(s) 1302 may have cache memory 1306 coupled to the processor(s) 1304 for rapid access to temporarily stored data. As an example, the cache memory 1306 could each include OCSC-based NV memory circuits 1301 including but not limited to the OCSC-based NV memory circuit 700 in FIGS. 7A-11. The CPU(s) 1302 may have cache memory 1306 coupled to the processor(s) 1304 for rapid access to temporarily stored data. The CPU(s) 1302 is coupled to a system bus 1308 and can intercouple master and slave devices included in the processor-based system 1300. As is well known, the CPU(s) 1302 communicates with these other devices by exchanging address, control, and data information over the system bus 1308. For example, the CPU(s) 1302 can communicate bus transaction requests to a memory controller 1310 as an example of a slave device. Although not illustrated in FIG. 13, multiple system buses 1308 could be provided, wherein each system bus 1308 constitutes a different fabric.

Other master and slave devices can be connected to the system bus 1308. As illustrated in FIG. 13, these devices can include a memory system 1312, one or more input devices 1314, one or more output devices 1316, one or more network interface devices 1318, and one or more display controllers 1320, as examples. Each of the memory system 1312, the one or more input devices 1314, the one or more output devices 1316, the one or more network interface devices 1318, and the one or more display controllers 1320 can include OCSC-based NV memory circuits 1301 including but not limited to the OCSC-based NV memory circuit 700 in FIGS. 7A-11. The input device(s) 1314 can include any type of input device, including, but not limited to, input keys, switches, voice processors, etc. The output device(s) 1316 can include any type of output device, including, but not limited to, audio, video, other visual indicators, etc. The network interface device(s) 1318 can be any device configured to allow exchange of data to and from a network 1322. The network 1322 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1318 can be configured to support any type of communications protocol desired. The memory system 1312 can include one or more memory units 1324(0)-1324(N).

The CPU(s) 1302 may also be configured to access the display controller(s) 1320 over the system bus 1308 to control information sent to one or more displays 1326. The display controller(s) 1420 sends information to the display(s) 1426 to be displayed via one or more video processors 1428, which process the information to be displayed into a format suitable for the display(s) 1426. The display(s) 1426 can include any type of display, including, but not limited to, a cathode ray tube (CRT), a liquid crystal display (LCD), a plasma display, a light emitting diode (LED) display, etc.

Figure 14:
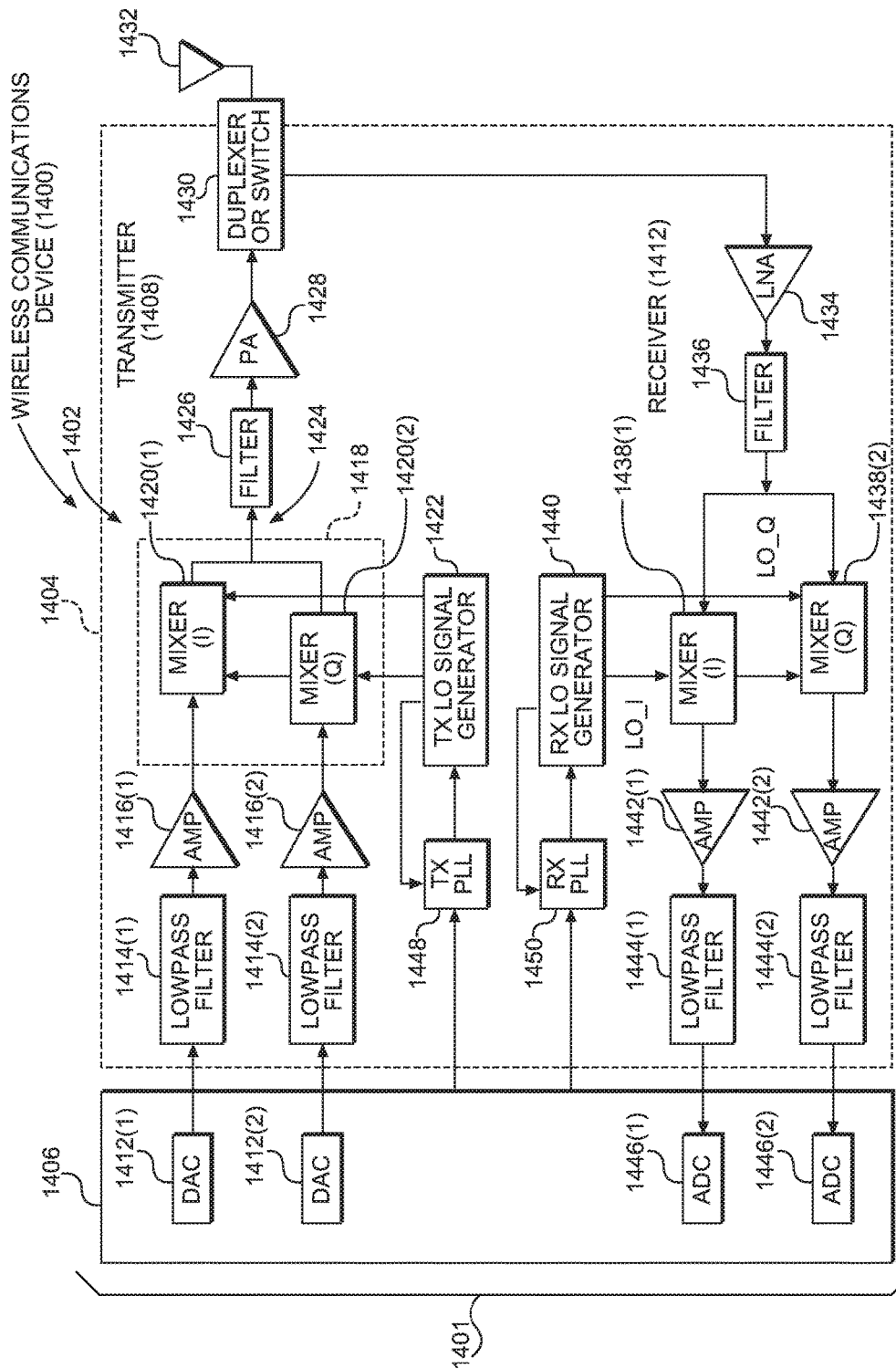
FIG. 14 is a block diagram of an exemplary wireless communications device that includes radio frequency (RF) components formed in an integrated circuit (IC), wherein any of the components therein include OCSC-based NV memory circuits, including but not limited to the OCSC-based NV memory circuit in FIGS. 7A-11.

FIG. 14 illustrates an exemplary wireless communications device 1400 that includes radio frequency (RF) components formed in an integrated circuit (IC) 1402, wherein any of the components therein can include OCSC-based NV memory circuits 1401 including but not limited to the OCSC-based NV memory circuit 700 in FIGS. 7A-11. In this regard, the wireless communications device 1400 may be provided in the IC 1402. The wireless communications device 1400 may include or be provided in any of the above referenced devices, as examples. As shown in FIG. 14, the wireless communications device 1400 includes a transceiver 1404 and a data processor 1406. The data processor 1406 may include a memory to store data and program codes. The transceiver 1404 includes a transmitter 1408 and a receiver 1410 that support bi-directional communications. In general, the wireless communications device 1400 may include any number of transmitters 1408 and/or receivers 1410 for any number of communication systems and frequency bands. All or a portion of the transceiver 1404 may be implemented on one or more analog ICs, RF ICs (RFICs), mixed-signal ICs, etc.

The transmitter 1408 or the receiver 1410 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1410. In the direct-conversion architecture, a signal is frequency-converted between RF and baseband in one stage. The super-heterodyne and direct-conversion architectures may use different circuit blocks and/or have different requirements. In the wireless communications device 1400 in FIG. 14, the transmitter 1408 and the receiver 1410 are implemented with the direct-conversion architecture.

In the transmit path, the data processor 1406 processes data to be transmitted and provides I and Q analog output signals to the transmitter 1408. In the exemplary wireless communications device 1400, the data processor 1406 includes digital-to-analog converters (DACs) 1412(1), 1412(2) for converting digital signals generated by the data processor 1406 into the I and Q analog output signals, e.g., I and Q output currents, for further processing.

Within the transmitter 1408, lowpass filters 1414(1), 1414(2) filter the I and Q analog output signals, respectively, to remove undesired signals caused by the prior digital-to-analog conversion. Amplifiers (AMP) 1416(1), 1416(2) amplify the signals from the lowpass filters 1414(1), 1414(2), respectively, and provide I and Q baseband signals. An upconverter 1418 upconverts the I and Q baseband signals with I and Q transmit (TX) local oscillator (LO) signals through mixers 1420(1), 1420(2) from a TX LO signal generator 1422 to provide an upconverted signal 1424. A filter 1426 filters the upconverted signal 1424 to remove undesired signals caused by the frequency upconversion as well as noise in a receive frequency band. A power amplifier (PA) 1428 amplifies the upconverted signal 1424 from the filter 1426 to obtain the desired output power level and provides a transmit RF signal. The transmit RF signal is routed through a duplexer or switch 1430 and transmitted via an antenna 1432.

In the receive path, the antenna 1432 receives signals transmitted by base stations and provides a received RF signal, which is routed through the duplexer or switch 1430 and provided to a low noise amplifier (LNA) 1434. The duplexer or switch 1430 is designed to operate with a specific receive (RX)-to-TX duplexer frequency separation, such that RX signals are isolated from TX signals. The received RF signal is amplified by the LNA 1434 and filtered by a filter 1436 to obtain a desired RF input signal. Down-conversion mixers 1438(1), 1438(2) mix the output of the filter 1436 with I and Q RX LO signals (i.e., LO_I and LO_Q) from an RX LO signal generator 1440 to generate I and Q baseband signals. The I and Q baseband signals are amplified by amplifiers (AMP) 1442(1), 1442(2) and further filtered by lowpass filters 1444(1), 1444(2) to obtain I and Q analog input signals, which are provided to the data processor 1406. In this example, the data processor 1406 includes ADCs 1446(1), 1446(2) for converting the analog input signals into digital signals to be further processed by the data processor 1406.

In the wireless communications device 1400 of FIG. 14, the TX LO signal generator 1422 generates the I and Q TX LO signals used for frequency upconversion, while the RX LO signal generator 1440 generates the I and Q RX LO signals used for frequency downconversion. Each LO signal is a periodic signal with a particular fundamental frequency. A TX phase-locked loop (PLL) circuit 1448 receives timing information from the data processor 1406 and generates a control signal used to adjust the frequency and/or phase of the TX LO signals from the TX LO signal generator 1422. Similarly, an RX PLL circuit 1450 receives timing information from the data processor 1406 and generates a control signal used to adjust the frequency and/or phase of the RX LO signals from the RX LO signal generator 1440.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A sensing circuit, comprising:
a differential amplifier, comprising:
    an output node configured to receive an output voltage;
    a complement output node configured to receive a complement output voltage;
    a differential transistor comprising a first gate, a first node, and a second node coupled to a ground node;
    a complement differential transistor comprising a second gate, a third node, and a fourth node coupled to the ground node;
    a pre-charge control circuit coupled between the first gate and the complement output node, the pre-charge control circuit configured to be activated to couple the first gate to the output node;
    a complement pre-charge control circuit coupled between the second gate and the output node, the complement pre-charge control circuit configured to be activated to couple the second gate to the complement output node;
    a ground control circuit coupled between the ground node and a capacitor node;
    a complement ground control circuit coupled between the ground node and a complement capacitor node;
    a capacitor circuit coupled between the first gate and the capacitor node; and
    a complement capacitor circuit coupled between the second gate and the complement capacitor node;
a non-volatile (NV) memory circuit coupled between the complement output node and a supply node, the NV memory circuit configured to store a memory state;
a complement NV memory circuit coupled between the output node and the supply node, the complement NV memory circuit configured to store a complement memory state complementary to the memory state; and
a differential amplifier control circuit coupled to a supply voltage node configured to receive a supply voltage and the supply node.

2. The sensing circuit of claim 1, further comprising:
a second pre-charge control circuit coupled between the capacitor node and the output node; and
a second complement pre-charge control circuit coupled between the complement capacitor node and the complement output node.

3. The sensing circuit of claim 2, wherein:
the second pre-charge control circuit comprises a first pass gate comprising a gate, a first node coupled to the capacitor node, and a second node coupled to the output node; and
the second complement pre-charge control circuit comprises a second pass gate comprising a gate, a first node coupled to the complement capacitor node, and a second node coupled to the complement output node.

4. The sensing circuit of claim 1, wherein:
the pre-charge control circuit comprises a pass gate comprising a gate, a first node coupled to the output node, and a second node coupled to the differential transistor; and
the complement pre-charge control circuit comprises a pass gate comprising a gate, a first node coupled to the complement output node, and a second node coupled to the complement differential transistor.

5. The sensing circuit of claim 1, wherein:
the ground control circuit comprises a transistor comprising a gate, a first node coupled to the capacitor node, and a second node coupled to the ground node; and
the complement ground control circuit comprises a transistor comprising a gate, a first node coupled to the complement capacitor node, and a second node coupled to the ground node.

6. The sensing circuit of claim 1, wherein:
the NV memory circuit comprises a magnetic tunnel junction (MTJ); and
the complement NV memory circuit comprises a complement MTJ.

7. The sensing circuit of claim 1, wherein:
the differential transistor comprises an N-type metal-oxide semiconductor (MOS) (NMOS) transistor; and
the complement differential transistor comprises an NMOS transistor.

8. The sensing circuit of claim 1, wherein:
the differential amplifier control circuit is coupled to a first pre-charge input;
the pre-charge control circuit is coupled to the first pre-charge input;
the complement pre-charge control circuit is coupled to the first pre-charge input;
the ground control circuit is coupled to the first pre-charge input; and
the complement ground control circuit is coupled to the first pre-charge input; and
in response to a first pre-charge input signal on the first pre-charge input indicating a first pre-charge operational phase:
the differential amplifier control circuit is configured to couple the supply voltage to the NV memory circuit and the complement NV memory circuit;
the ground control circuit is configured to couple the capacitor node to the ground node;
the complement ground control circuit is configured to couple the complement capacitor node to the ground node;
the pre-charge control circuit is configured to couple the NV memory circuit to the first gate of the differential transistor to pre-charge the first gate of the differential transistor to a first pre-charge voltage based on the supply voltage, and store the first pre-charge voltage in the capacitor circuit; and
the complement pre-charge control circuit is configured to couple the complement NV memory circuit to the second gate of the complement differential transistor to pre-charge the second gate of the complement differential transistor to a first complement pre-charge voltage based on the supply voltage, and store the first complement pre-charge voltage in the complement capacitor circuit.

9. The sensing circuit of claim 8, wherein:
the pre-charge control circuit is coupled to an offset-cancellation input;
the complement pre-charge control circuit is coupled to the offset-cancellation input;
the ground control circuit is coupled to the offset-cancellation input; and
the complement ground control circuit is coupled to the offset-cancellation input; and
in response to an offset-cancellation input signal on the offset-cancellation input indicating an offset-cancellation operational phase:
the ground control circuit is configured to couple the capacitor node to the ground node;
the complement ground control circuit is configured to couple the complement capacitor node to the ground node;
the pre-charge control circuit is configured to couple the first gate of the differential transistor to the first node of the differential transistor to discharge the capacitor circuit on the first gate of the differential transistor to a threshold voltage of the differential transistor; and
the complement pre-charge control circuit is configured to couple the second gate of the complement differential transistor to the third node of the complement differential transistor to discharge the first complement pre-charge voltage from the complement capacitor circuit on the first gate of the differential transistor to a complement threshold voltage of the complement differential transistor;
the threshold voltage on the first gate of the differential transistor and the complement threshold voltage of the second gate of the complement differential transistor configured to substantially cancel an offset voltage of the differential amplifier control circuit.

10. The sensing circuit of claim 9, wherein in response to the offset-cancellation input signal indicating the offset-cancellation operational phase, the differential amplifier control circuit is configured to decouple the supply voltage from the NV memory circuit and the complement NV memory circuit.

11. The sensing circuit of claim 9, wherein:
the ground control circuit is coupled to a second pre-charge input; and
the complement ground control circuit is coupled to the second pre-charge input; and
in response to a second pre-charge input signal on the second pre-charge input indicating a second pre-charge operational phase:
the ground control circuit is configured to couple the capacitor node to the ground node to pre-charge the output node to a ground voltage on the ground node; and
the complement ground control circuit is configured to couple the complement capacitor node to the ground node to pre-charge the complement output node to the ground voltage on the ground node.

12. The sensing circuit of claim 11, wherein in response to the second pre-charge input signal indicating the second pre-charge operational phase:
the differential amplifier control circuit is configured to decouple the supply voltage from the NV memory circuit and the complement NV memory circuit;
the pre-charge control circuit is configured to decouple the NV memory circuit from the first gate of the differential transistor; and
the complement pre-charge control circuit is configured to decouple the complement NV memory circuit from the second gate of the complement differential transistor.

13. The sensing circuit of claim 11, wherein:
the differential amplifier control circuit is coupled to a comparison input; and
in response to a comparison input signal on the comparison input indicating a comparison operational phase:
the differential amplifier control circuit is configured to couple the supply voltage to the NV memory circuit and the complement NV memory circuit;

the sensing circuit is configured to apply a voltage on the first node of the differential transistor to the second gate of the complement differential transistor; and the sensing circuit is configured to apply is configured a complement voltage on the third node of the complement differential transistor to the first gate of the differential transistor;

wherein:

the output voltage on the output node represents a difference in resistance between the NV memory circuit and the complement NV memory circuit; and the complement output voltage on the complement output node represents a difference in resistance between the complement NV memory circuit and the NV memory circuit.

14. The sensing circuit of claim 13, wherein:

the pre-charge control circuit is coupled to the comparison input;

the complement pre-charge control circuit is coupled to the comparison input; and in response to the comparison input signal on the comparison input indicating the comparison operational phase:

the pre-charge control circuit is configured to decouple the first gate of the differential transistor from the NV memory circuit; and the complement pre-charge control circuit is configured to decouple the second gate of the complement differential transistor from the complement NV memory circuit.

15. The sensing circuit of claim 1 integrated into an integrated circuit (IC).

16. The sensing circuit of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

17. A sensing circuit, comprising:

a means for pre-charging a gate of a differential transistor to a pre-charge voltage based on a supply voltage coupled to a supply node, the differential transistor coupled between a non-volatile (NV) memory circuit and a ground node, and a means for pre-charging a gate of a complement differential transistor to a complement pre-charge voltage based on the supply voltage coupled to the supply node, the complement differential transistor coupled between a complement NV memory circuit and the ground node;

a means for pre-charging a capacitor circuit coupled between the gate of the differential transistor and the ground node based on the pre-charge voltage applied to the gate of the differential transistor, and a means for pre-charging a complement capacitor circuit coupled between the gate of the complement differential transistor and the ground node based on the complement pre-charge voltage applied to the gate of the complement differential transistor;

a means for discharging the capacitor circuit onto the gate of the differential transistor to couple the NV memory circuit to the ground node to discharge the pre-charge voltage on the gate of the differential transistor to a threshold voltage of the differential transistor, and a means for discharging the complement capacitor circuit onto the gate of the complement differential transistor to couple the complement NV memory circuit to the ground node to discharge the complement pre-charge voltage on the gate of the complement differential transistor to a complement threshold voltage of the complement differential transistor, to substantially cancel offset voltages of the differential transistor and the complement differential transistor;

a means for pre-charging an output node to a ground voltage on the ground node coupled to the complement NV memory circuit, and a means for pre-charging a complement output node to the ground voltage on the ground node coupled to the NV memory circuit; and a means for applying the supply voltage to the NV memory circuit to generate a read current through the NV memory circuit based on a resistance of the NV memory circuit to generate a complement output voltage on the complement output node to activate the complement differential transistor, and a means for applying the supply voltage to the complement NV memory circuit to generate a complement read current through the complement NV memory circuit based on a resistance of the complement NV memory circuit to generate the output voltage on the output node to activate the differential transistor, such that the output voltage on the output node represents a difference in resistance between the NV memory circuit and the complement NV memory circuit, wherein the complement output voltage on the complement output node represents a difference in resistance between the complement NV memory circuit and the NV memory circuit.

18. A method of sensing a differential voltage based on a difference in stored memory states in a non-volatile (NV) memory circuit and a complement NV memory circuit, comprising:

pre-charging a first gate of a differential transistor to a pre-charge voltage based on a supply voltage coupled to a supply node, the differential transistor coupled between an NV memory circuit and a ground node, and pre-charging a second gate of a complement differential transistor to a complement pre-charge voltage based on the supply voltage coupled to the supply node, the complement differential transistor coupled between a complement NV memory circuit and the ground node;

pre-charging a capacitor circuit coupled between the gate of the differential transistor and the ground node based on the pre-charge voltage applied to the gate of the differential transistor, and pre-charging a complement capacitor circuit coupled between the gate of the complement differential transistor and the ground node based on the complement pre-charge voltage applied to the gate of the complement differential transistor;

discharging the capacitor circuit onto the gate of the differential transistor to couple the NV memory circuit to the ground node to discharge the pre-charge voltage on the gate of the differential transistor to a threshold voltage of the differential transistor, and discharging the complement capacitor circuit onto the gate of the complement differential transistor to couple the complement NV memory circuit to the ground node to discharge the complement pre-charge voltage on the gate of the complement differential transistor to a complement threshold voltage of the complement differential transistor, to substantially cancel offset voltages of the differential transistor and the complement differential transistor;

pre-charging an output node to a ground voltage on the ground node coupled to the complement NV memory circuit, and pre-charging a complement output node to the ground voltage on the ground node coupled to the NV memory circuit; and applying the supply voltage to the NV memory circuit to generate a read current to flow through the NV memory circuit based on a resistance of the NV memory circuit to generate a complement output voltage on the complement output node to activate the complement differential transistor, and applying the supply voltage to the complement NV memory circuit to generate a complement read current to flow through the complement NV memory circuit based on a resistance of the complement NV memory circuit to generate an output voltage on the output node to activate the differential transistor, such that the output voltage on the output node represents a difference in resistance between the NV memory circuit and the complement NV memory circuit, the complement output voltage on the complement output node represents a difference in resistance between the complement NV memory circuit and the NV memory circuit.

19. A non-volatile (NV) memory circuit, comprising:
a latch circuit, comprising:
  a latch input configured to receive an input data signal; and
  a latch output;
  the latch circuit configured to latch input data based on the received latch input data signal and generate an output data signal on the latch input based on the latch input data;
a sensing circuit, comprising:
  a differential amplifier, comprising:
    an output node configured to receive an output voltage;
    a complement output node configured to receive a complement output voltage;
    a differential transistor comprising a first gate, a first node, and a second node coupled to a ground node;
    a complement differential transistor comprising a second gate, a third node, and a fourth node coupled to the ground node;
    a pre-charge control circuit coupled between the first gate and the output node, the first pre-charge control circuit configured to be activated to couple the first gate to the output node;
    a complement pre-charge control circuit coupled between the second gate and the complement output node, the complement pre-charge control circuit configured to be activated to couple the second gate to the complement output node;
    a ground control circuit coupled between the ground node and a capacitor node;
    a complement ground control circuit coupled between the ground node and a complement capacitor node;
    a capacitor circuit coupled between the first gate and the capacitor node; and
    a complement capacitor circuit coupled between the second gate and the complement capacitor node;
  the NV memory circuit coupled between the complement output node and a supply node, the NV memory circuit configured to store a memory state;
  a complement NV memory circuit coupled between the output node and the supply node, the complement NV memory circuit configured to store a complement memory state complementary to the memory state; and
  a differential amplifier control circuit coupled to a supply voltage node configured to receive a supply voltage and the supply node; and
a write circuit coupled to the latch output, the output node, and the complement output node, configured to receive the latch input data, the write circuit configured to write a write output signal based on the output data signal to the output node to be stored in the NV memory circuit, and write a complement write output signal, complementary to the write output signal, based on the output data signal to the complement output node to be stored in the complement NV memory circuit.

20. The NV memory circuit of claim 19, wherein the latch circuit does not share any transistors with the sensing circuit.

21. The NV memory circuit of claim 19, wherein the write circuit further comprises a write enable input; and
in response to a write enable signal on the write enable input indicating a write operational phase, the write circuit is configured to assert the latch output to the output node to cause a current to flow through the NV memory circuit and the complement NV memory circuit to program the NV memory circuit to the memory state based on the latch output and program the complement NV memory circuit to the complement memory state based on the latch output.

22. The NV memory circuit of claim 21, wherein the NV memory circuit comprises a magnetic tunnel junction (MTJ) and the complement NV memory circuit comprises a complement MTJ.

23. The NV memory circuit of claim 22, wherein, in response to the write enable signal on the write enable input indicating the write operational phase and the latch output being a logical '0' memory state, the write circuit is configured to assert the latch output to the output node to cause a current to flow from the MTJ to the complement MTJ to program the MTJ to an anti-parallel (AP) magnetic orientation and program the complement MTJ to a parallel (P) magnetic orientation.

24. The NV memory circuit of claim 22, wherein in response to the write enable signal on the write enable input indicating the write operational phase and the latch output being a logical '1' memory state, the write circuit is configured to assert the latch output to the output node to cause a current to flow from the complement MTJ to the MTJ to program the complement MTJ to an anti-parallel (AP) magnetic orientation and program the MTJ to a parallel (P) magnetic orientation.

25. The NV memory circuit of claim 19, wherein the write circuit further comprises:
a write driver circuit coupled to the output node; and
the write driver circuit configured to assert the write output signal based on the output data signal to the output node and assert the complement write output signal based on the complement output data signal to the complement output node.

26. The NV memory circuit of claim 19, wherein the latch circuit comprises a flip-flop.

\* \* \* \* \*